United States Patent
Nakayama

(10) Patent No.: US 7,139,537 B2
(45) Date of Patent: Nov. 21, 2006

(54) TRANSMISSION OUTPUT CIRCUIT AND MOBILE COMMUNICATION TERMINAL

(75) Inventor: Takashi Nakayama, Chiba (JP)

(73) Assignee: Sony Ericsson Mobile Communications, Tokyo (JP)

( * ) Notice: Subject to any disclaimer, the term of this patent is extended or adjusted under 35 U.S.C. 154(b) by 71 days.

(21) Appl. No.: 10/475,441

(22) PCT Filed: Feb. 20, 2003

(86) PCT No.: PCT/JP03/01885

§ 371 (c)(1),
(2), (4) Date: May 3, 2004

(87) PCT Pub. No.: WO03/071694

PCT Pub. Date: Aug. 28, 2003

(65) Prior Publication Data

US 2004/0180686 A1   Sep. 16, 2004

(30) Foreign Application Priority Data

Feb. 21, 2002   (JP)   ............... 2002-044463

(51) Int. Cl.
*H04B 1/04* (2006.01)

(52) U.S. Cl. ............... 455/127.1; 455/127.3; 455/522; 455/126

(58) Field of Classification Search .......... 455/69, 455/127.1, 127.2, 127.3, 126, 522, 234.1, 455/232.1, 422.1, 127.4, 127.5, 432.1, 434.1, 455/67.11–67.14, 114.1–115.4
See application file for complete search history.

(56) References Cited

U.S. PATENT DOCUMENTS 5,287,555 A   2/1994   Wilson et al.

(Continued)

FOREIGN PATENT DOCUMENTS

JP   62-14836   1/1987

(Continued)

*Primary Examiner*—Lana Le
(74) *Attorney, Agent, or Firm*—Frommer Lawreence & Haug LLP; William S. Frommer; Thomas F. Presson

(57) ABSTRACT

A transmission output circuit can always perform correct transmission power control, and can detect the abnormality of transmission power, which interferes with other users, and part troubles, which cause erroneous transmission. The transmission output circuit includes transmission power control data generation means for generating a gain control signal for performing the feed forward control of gain control amplification means in order that the output signal level of the power amplification means may be a target transmission power output level, detection means for detecting the output signal of the power amplification means to obtain detected signal data, and judgment means for judging the existence of the occurrence of trouble in the transmission output system by using the detected signal data from the detection means.

19 Claims, 14 Drawing Sheets

U.S. PATENT DOCUMENTS

| | | | |
|---|---|---|---|
| 5,420,536 A * | 5/1995 | Faulkner et al. | 330/149 |
| 5,438,683 A * | 8/1995 | Durtler et al. | 455/126 |
| 5,732,334 A | 3/1998 | Miyake | |
| 5,999,829 A * | 12/1999 | Chun et al. | 455/127.4 |
| 6,115,587 A | 9/2000 | Kim | |
| 6,216,012 B1 * | 4/2001 | Jensen | 455/553.1 |
| 6,272,336 B1 | 8/2001 | Appel et al. | |
| 6,304,749 B1 | 10/2001 | Obara | |
| 6,334,050 B1 * | 12/2001 | Skarby | 455/115.3 |
| 6,560,448 B1 * | 5/2003 | Baldwin et al. | 455/234.1 |
| 6,704,579 B1 * | 3/2004 | Woodhead et al. | 455/522 |
| 6,711,389 B1 * | 3/2004 | Medl et al. | 455/127.2 |
| 6,731,915 B1 * | 5/2004 | Tran et al. | 455/126 |
| 6,763,228 B1 * | 7/2004 | Prentice et al. | 455/127.2 |
| 2002/0072339 A1 * | 6/2002 | Hamalainen | 455/126 |
| 2003/0022687 A1 * | 1/2003 | Iida et al. | 455/522 |
| 2005/0130595 A1 * | 6/2005 | Shurvinton et al. | 455/67.11 |

FOREIGN PATENT DOCUMENTS

| | | | |
|---|---|---|---|
| JP | 7-123021 | | 5/1995 |
| JP | 9-199963 | | 7/1997 |
| JP | 11-205165 | * | 7/1999 |
| JP | 2000-49629 | | 2/2000 |
| JP | 2000-165261 | | 6/2000 |
| JP | 2000-216726 | | 8/2000 |
| JP | 2001-86010 | | 3/2001 |
| JP | 2001-223637 | | 8/2001 |
| JP | 2001-308724 | | 11/2001 |

* cited by examiner

TRANSMISSION OUTPUT CIRCUIT AND MOBILE COMMUNICATION TERMINAL

TECHNICAL FIELD

This invention relates to a transmission output circuit suitable for the application to, for example, a mobile communication terminal by the Direct Sequence-Code Division Multiple Access system (hereinafter called as DS-CDMA system), and especially relates to a transmission power control.

BACKGROUND ART

Generally, in mobile communication by the DS-CDMA system, even if each mobile station (mobile communication terminal) performs a transmission with the same transmission power in an up link from the mobile station to a base station, because distances and propagation environments from respective mobile stations to the base station are different, the so-called far-and-near problem in which the transmission signal of a mobile station located at a position near the base station masks the transmission signal of a mobile station located at a position distant from the base station occurs.

Consequently, it is important in the mobile communication by the DS-CDMA system to control the transmission power of each mobile station in order that reception signal levels from all of the mobile stations may be fixed at the base station.

As the methods of transmission power control in mobile stations in the mobile communication by the DS-CDMA system, there are an open loop transmission power control method and a closed loop transmission power control method.

The open loop transmission power control method is a method in which a mobile station itself variably controls its transmission power according to the field levels (reception field levels) of reception signals from a base station. In the open loop transmission power control, a wide range variable control of more than 10 dB is performed at one time of control in order to obtain desired transmission power. It is necessary in the open loop transmission power control to ensure the absolute value of the transmission power.

On the other hand, the closed loop transmission power control method is a method in which a base station performs a closed loop control for ensuring the output levels of up link signals between mobile communication terminals and the base station in order that the reception levels of the up link signals from the mobile stations may be fixed. That is, the base station generates a Transmit Power Control (TPC) command on the basis of the reception result of an up link signal from a mobile station, and transmits the generated TPC command to the mobile station to perform the variable control of the transmission power of the mobile station.

In the closed loop transmission power control, in each mobile station, a narrow range variable control by a level in the range of from one to three dB is performed on the basis of the TPC commands from the base station to perform an adjustment to a desired transmission power. In the closed loop transmission power control, it is necessary to ensure relative values of the transmission power of the mobile stations.

Incidentally, a transmission output circuit of a conventional mobile communication terminal in the DS-CDMA system to which the above-mentioned open loop transmission power control method or the closed loop transmission power control method is applied is configured, for example, as shown in FIG. 13. The transmission output circuit of FIG. 13 will be described in the following.

In FIG. 13, 100 designates a transmission signal processing system of a mobile communication terminal by the DS-CDMA system, and 200 designates a transmission power control system.

The transmission signal processing system 100 performs the up conversion of an input transmission signal in an intermediate frequency band (hereinafter referred as an IF band transmission signal) Sif, which was performed a spread spectrum processing and a predetermined orthogonal modulation, to a radio frequency (RF) band transmission signal, and further, applies a power amplification to the RF band transmission signal, supplies to an antenna 1 through an antenna connector end 2, and transmits the RF band transmission signal to a base station.

Then, the transmission signal processing system 100 performs the automatic gain control (AGC) of the IF band transmission signal and the RF band transmission signal by means of an AGC signal from the transmission power control system 200, and thereby controls the electric power of the transmission signal to be a desired power. The more detailed configurations and the processing operations of the transmission signal processing system 100 will be described in the following.

That is, the IF band transmission signal is supplied to an IF band AGC amplifier 101, and amplified while performing the gain control of the IF band transmission signal by means of an IF band transmission signal AGC voltage IFagc supplied from the transmission power control system 200 through an D/A converter 102.

The IF band transmission signal amplified by the IF band AGC amplifier 101 is limited its band by an IF band band pass filter (IF band BPF) 103, and then is supplied to a mixer circuit 104. In the mixer circuit 104, the IF band transmission signal is mixed with a local frequency signal from a local oscillation unit 105 and is performed the up conversion to a frequency signal in the RF band (hereinafter, referred to as an RF band transmission signal).

The RF band transmission signal from this mixer circuit 104 is amplified while performing the gain control by means of an RF band AGC voltage RFagc supplied from the transmission power control system 200 through a D/A converter 107 in an RF band AGC amplifier 106. After the amplified RF band transmission signal is limited its band by an RF band band pass filter (RF band BPF) 108, the RF band transmission signal is supplied to a power amplifier 109, and is amplified to a predetermined electric power.

The RF band transmission signal, the electric power of which was amplified by the power amplifier 109, is transmitted to the antenna connector end 2 through an isolator 110 and a duplexer 111, and is transmitted from the antenna 1.

Transmission power control data Cif and Crf, which are digital data as bases of the above-mentioned IF band transmission signal AGC voltage IFagc and the RF band transmission signal AGC voltage RFagc, are generated by the transmission power control system 200 in the way to be described in the following.

The transmission power control system 200 includes a transmission power control data processing unit 201, a transmission power control data table memory 202 which stores a transmission power control data table, and a transmission power control data correction table memory 203 which stores a transmission power control data correction table. The transmission power control data processing unit 201 is composed of, for example, a Digital Signal Processor (DSP).

In the transmission power control data table memory 202, transmission power control data, which becomes optimum to various values of the transmission power output level of the transmission signal intended to be transmitted and instructed by instruction data Po under environmental conditions such as a predetermined power supply voltage, a temperature, a transmission frequency, and the like, is written as the transmission power control data table in the way which will be described later.

Moreover, in the transmission power control data correction table memory 203, information of the transmission power control data correction table for correcting each transmission power control data written in the transmission power control data table according to parameters such as the environmental conditions is written in the way which will be described later.

In the conventional case, as the parameters for the transmission power control data correction table, an environmental temperature (an ambiance temperature) at the use of the transmission output circuit, the power supply voltage and the frequency of the transmission signal are used.

Then, the transmission power control data processing unit 201 in the transmission power control system 200 receives the voltage of a power supply 112 of the power amplifier 109, the information of the ambiance temperature of the mobile communication terminal in which the transmission signal processing system 100 is mounted, and the information Fx of a transmission frequency from a not shown communication control unit, which are the parameters. The transmission power control data processing unit 201 further receives the instruction data Po instructing the transmission power output level of a transmission signal intended to be transmitted, and refers to the tables in the transmission power control data table memory 202 and the transmission power control data correction table memory 203 to operate the transmission power control data Cif and Crf which are optimum to the transmission power output level of the transmission signal intended to be transmitted. Then, the transmission power control data processing unit 201 outputs the operated transmission power control data Cif and Crf.

Hereupon, after the voltage of the power supply 112 of the power amplifier 109 is converted to digital data by an A/D converter 113, then the converted digital data is supplied to the transmission power control data processing unit 201 in the transmission power control system 200. Moreover, a temperature sensor 114 is provided in the transmission signal processing system 100 and the temperature information in the vicinity of the transmission signal processing system 100 which was detected by the temperature sensor 114 is converted to digital data by the A/D converter 113, and then thus converted digital data is supplied to the transmission power control data processing unit 201 of the transmission power control system 200.

FIG. 14 is a diagram for explaining the writing of the information in the transmission power control data table into the transmission power control data table memory 202, and the writing of the information in the transmission power control data correction table into the transmission power control data correction table memory 203.

As to the information in the transmission power control data correction table, the correction data of the transmission power control data to temperature changes, power supply voltage changes, transmission frequency changes as the parameters is previously produced at the stage of designing and/or the stage of developing the transmission output circuit or the mobile communication terminal. Then, the produced correction data of the transmission power control data is written into the transmission power control data correction table memory 203 through an external interface (external I/F) 204 as the transmission power control data correction table by means of a control data writing unit 21 shown in FIG. 14 on an adjustment line at the time of mass production of the transmission output circuit, or on an adjustment line at the time of mass production of the mobile communication terminal which mounts the transmission output circuit thereon.

The information in the transmission power control data table is a correspondence table of various target transmission power output levels pertaining to a transmission signal in a predetermined environmental condition and the transmission power control data to the transmission power output levels. The writing of the transmission power control data table into the transmission power control data table memory 202 is executed as follows.

A certain target transmission power output level is supposed. While the RF band transmission signal output from the antenna connector end 2 is monitored with a power meter and a transmitter tester 22, the transmission power control data is adjusted in order that the RF band transmission signal output may take the target transmission power output level. When the RF band transmission signal output takes the target transmission power output level, the transmission power control data at that time is written into the transmission power control data table memory 202 as the transmission power control data corresponding to the target transmission power output level. By performing the operation described above to all of the values of the necessary target transmission power output levels, the transmission power control data table is written into the transmission power control data table memory 202.

At the time of the writing, the ambient temperature, the voltage of the power supply 112, the frequency of the RF band transmission signal, and the like at the time of the writing of the transmission power control data are held in the transmission power control data table memory 202 as standard parameter information. Otherwise, the standard information is held by the transmission power control data processing unit 201.

As described above, the transmission power control data processing unit 201 outputs the transmission power control data Cif and Crf being the digital data to be the bases of the IF band transmission signal AGC voltage IFagc and the RF band transmission signal AGC voltage RFagc using the table information written in each of the table memories 202 and 203 as follows.

First, the transmission power control data processing unit 201 refers to the signal Po instructing the transmission power output level of the transmission signal which is intended to be transmitted and is supplied to the transmission power control data processing unit 201, and extracts the transmission power control data which makes it to be the transmission power output level from the transmission power control data table in the transmission power control data table memory 202.

Next, the transmission power control data processing unit 201 compares the digital data of the power supply voltage from the A/D converter 113, the digital data of the temperature information detected by the temperature sensor 114 from the A/D converter 115, and the information Fx of the transmission frequency with the above-mentioned standard data related to the transmission power control data table, and on the basis of the comparison result, the transmission power control data processing unit 201 extracts suitable transmission power control data correction data from the transmission power control data correction table in the transmission power control data correction table memory 203.

Then, the transmission power control data processing unit 201 operates the optimum transmission power control data to the output level at which transmission is intended to be performed on the basis of the data value of the transmission power control data obtained from the transmission power control data table memory 202, the present power supply voltage, and the data information of the temperature and the transmission frequency. As the transmission power control data, as described before, the IF band AGC data IFagc and RF band AGC data RFagc are severally operated, and then they are transferred to the D/A converters 102 and 107.

Thus, the transmission power control data processing unit 201 generates the transmission power control data Cif and Crf from which the influences of the environmental parameters such as the temperature, the power supply voltage, the using frequency and the like in the actual usage environmental condition are removed. Then, the AGC control of transmission signals is performed at the AGC amplifiers 101 and 106 by means of the AGC voltages IFagc and RFagc, which are the D/A conversion outputs of the transmission power control data Cif and Crf, and thereby the transmission signal is controlled in order that the target desired transmission power can be obtained from the power amplifier 109.

As described above, the transmission power control method of the transmission output circuit of the conventional mobile communication terminal adopts a correction table in which correction values to frequency changes, temperature changes and power supply voltage changes are severally written on adjustment lines at mass production in advance, and thereby performs a transmission power control by a feed forward system which compensates the transmission power according to ambient environment changes.

However, in the case where the above-mentioned conventional transmission power control method is actually applied to the mobile communication system by the DS-CDMA system, the following problems exist.

Because the conventional transmission power control shown in FIG. 13 is the feed forward system as described above, it is not examined whether the electric power of an actually transmitted transmission signal takes the target transmission power output level correctly or not. Consequently, there is no assurance of the output of the power amplifier 109 taking the target desired transmission power output level. Consequently, if any abnormality of transmission power or erroneous transmission is caused when each part constituting the transmission signal processing system 100 such as the power amplifier 109, the Rf band AGC amplifier 106 and the like is out of order, the conventional method can not detect it.

The abnormality of the transmission power in the mobile communication system by the DS-CDMA system causes defects such as the interference with other users, nonarrival of an up link signal to a base station in a fringe area of a cell, and the like.

On the other hand, in the Third Generation Partnership Project (3GPP) Standards and the TELEC Standards in Japan, there are regulations concerning the items pertaining to the maximum transmission power and the minimum transmission power (the items of the deviation of antenna power) as the transmission characteristics of the mobile communication terminal by the DS-CDMA system.

The items pertaining to the maximum transmission power regulate the ability for transmitting the maximum transmission power defined on the basis of the power class of mobile devices of the mobile communication terminal while keeping the maximum transmission power within a regulated level range. Moreover, the items pertaining to the minimum transmission power similarly regulate the minimum transmission power defined on the basis of the power class of mobile devices of the mobile communication terminal.

When a mobile communication terminal by the DS-CDMA system especially performs a transmission at the maximum transmission power, it is necessary to compensate the quantities of variations of the RF active components of the transmission signal processing system 100 such as the power amplifier, the RF band AGC amplifier, the IF band AGC amplifier and the like to the environmental condition changes such as the frequency, the power supply voltage, the temperature and the like.

In addition, in the case where the mobile communication terminal is mass-produced, due to dispersion among individual parts, even if the correction table to the frequencies, the power supply voltages and the temperatures which are uniquely determined at the stage of designing or development is provided like conventional embodiment, some deviations from the information in the correction table are produced in the above-mentioned transmission signal processing system 100.

That is, in the above-mentioned conventional transmission power control of a feed forward system, it is not easy to meet the standard values of the maximum transmission power in case of the mass-production of the mobile communication terminal. Moreover, it is also not easy to satisfy the standard values as to the minimum transmission power similarly.

Moreover, the DS-CDMA system mobile communication terminal uses a multi-code transmission for implementing a high speed data rate. Because a plurality of code channels are multiplexed by means of plural kinds of spread codes in the multi-code transmission, a peak power to the average transmission power changes according to the number of multiplexed channels. Accordingly, it is necessary to correct the transmission power output level according to a changed number of multiplexed channels when the number of multiplexed channels is changed.

However, as described above, the conventional transmission power control method by the feed forward system includes the correction table to the frequencies, the power supply voltage, and the temperatures, but does not include any correction table to the number of multiplexed channels. Moreover, even if the mobile communication terminal includes the correction table to the number of multiplexed channels, as described above, it is not easy to satisfy the standard values in the case where the number of multiplexed channels is changed when an up link signal is transmitted at the maximum transmission power or the minimum transmission power.

Then, in the case where the standard values of the transmission characteristic is not satisfied, as described above, the problems such as the decrease of the capacity of a cell based on the interference with other users, the nonarrival of an up link signal in a fringe area of a cell, and the like exist.

In this case, the mobile communication terminal performs adjustment to desired transmission power by means of the narrow range variable control based on the TPC control from the base station in the closed loop transmission power control. However, because the adjustment is performed by the step within the range of from one to three dB at the utmost, the problems continue for a while. Moreover, above all, not satisfying the standard values is a big problem as the mobile communication terminal.

This invention, in view of the problems described above, aims to provide a transmission output circuit capable of always performing accurate transmission power control, and capable of detecting the abnormality of transmission power which causes interference with other users and the failures of parts which cause erroneous transmission.

DISCLOSURE OF THE INVENTION

For solving the above problems, a transmission output circuit according to the present invention is characterized by: gain control amplification means for varying gain of an input signal in accordance with a gain control signal; power amplification means for amplifying power of an output signal from the gain control amplification means; transmission power output level instruction means for specifying a target transmission power output level; transmission power control data generation means for generating the gain control signal for performing a feed forward control of the gain control amplification means in order that an output signal level of the power amplification means becomes the target transmission power output level; detection means for obtaining detected signal data by detecting the output signal of the power amplification means; and judgment means for judging existence of occurrence of trouble in a transmission output system by means of the detected signal data from the detection means.

According to the transmission output circuit having the above-mentioned configuration, the output of the power amplifier is detected, and it is possible to judge whether any trouble occurs in the parts of the transmission output system on the basis of the detection output. Consequently, by means of the detection result, it is possible to prevent interfere with other users by stopping transmission, or the like in case of an abnormal transmission power output level.

Moreover, a transmission output circuit according to another aspect of the present invention includes a transmission output apparatus characterized by: gain control amplification means for varying gain of an input signal in accordance with a gain control signal; power amplification means for performing power amplification of an output signal of the gain control amplification means to obtain a transmission signal having a transmission power output level; detection means for detecting an output signal of the power amplification means to obtain detected signal data; a detected signal data table in which the detected signal data corresponding to various values of the transmission power output level is written; a transmission power control data table in which transmission power control data for generating control voltages to be supplied to the gain control amplification means, the control voltages corresponding to various values of the transmission power output level, is written; detected signal data comparison means for comparing the detected signal data obtained by the detection means with detected signal data corresponding to the target transmission power output level from the detected signal data table; transmission power control data processing means for operating transmission power control data to the target transmission power output level on a basis of present transmission power control data from the transmission power control data table and comparison output data from the detection signal comparison means; D/A conversion means for performing D/A conversion of the transmission power control data to the target transmission power output level from the transmission power control data processing means to use the converted transmission power control data as the control voltage of the gain control amplification means, wherein the transmission power control data processing means operates the transmission power control data to the target transmission power output level in order that comparison output data of the detected signal data comparison means correction operation of the transmission power control data to the target transmission power output level in order that comparison output data of the detection signal data comparison means may be a predetermined value or less to output the operated transmission power control data.

According to the present invention, not only the transmission power control by the feed forward control is performed, but also the output level of the power amplifier is detected with the detection means. Then, the difference between the detected signal data being the detection output and the detected signal data corresponding to the target transmission power output level is made to be a predetermined value or less. In this state, the transmission power control data is operated to be obtained. Thereby, it is possible to make the transmission power output level always satisfy the standard of transmission characteristics, and then the defects in the conventional case using only the feed forward control can be prevented.

Moreover, a transmission output circuit according to further aspect of the present invention is the transmission output circuit according to claim 1, the circuit characterized by: a transmission power control data correction table in which correction data of the transmission power control data using a transmission frequency and/or a number of transmission multiplexed channels as parameters is written, wherein the transmission power control data processing means obtains correction data of the transmission power control data corresponding to a present transmission frequency and/or a present number of multiplexed channels from the transmission power control data correction table to operate the transmission power control data to the target transmission power output level.

According to the present invention, even when the number of multiplexed channels changes, it is possible to perform transmission power control for obtaining the transmission power output level satisfying the transmission standard anytime.

BEST MODE FOR CARRYING OUT THE INVENTION

Hereinafter, the drawings are referred to while the embodiments of a transmission output circuit and a mobile communication terminal according to this invention. The embodiments to be described in the following concern the case where this invention is applied to a transmission power control in a DS-CDMA system mobile communication terminal, for example, a mobile telephone terminal.

[Descriptions of Configuration of the Mobile Communication Terminal]

Figure 3:
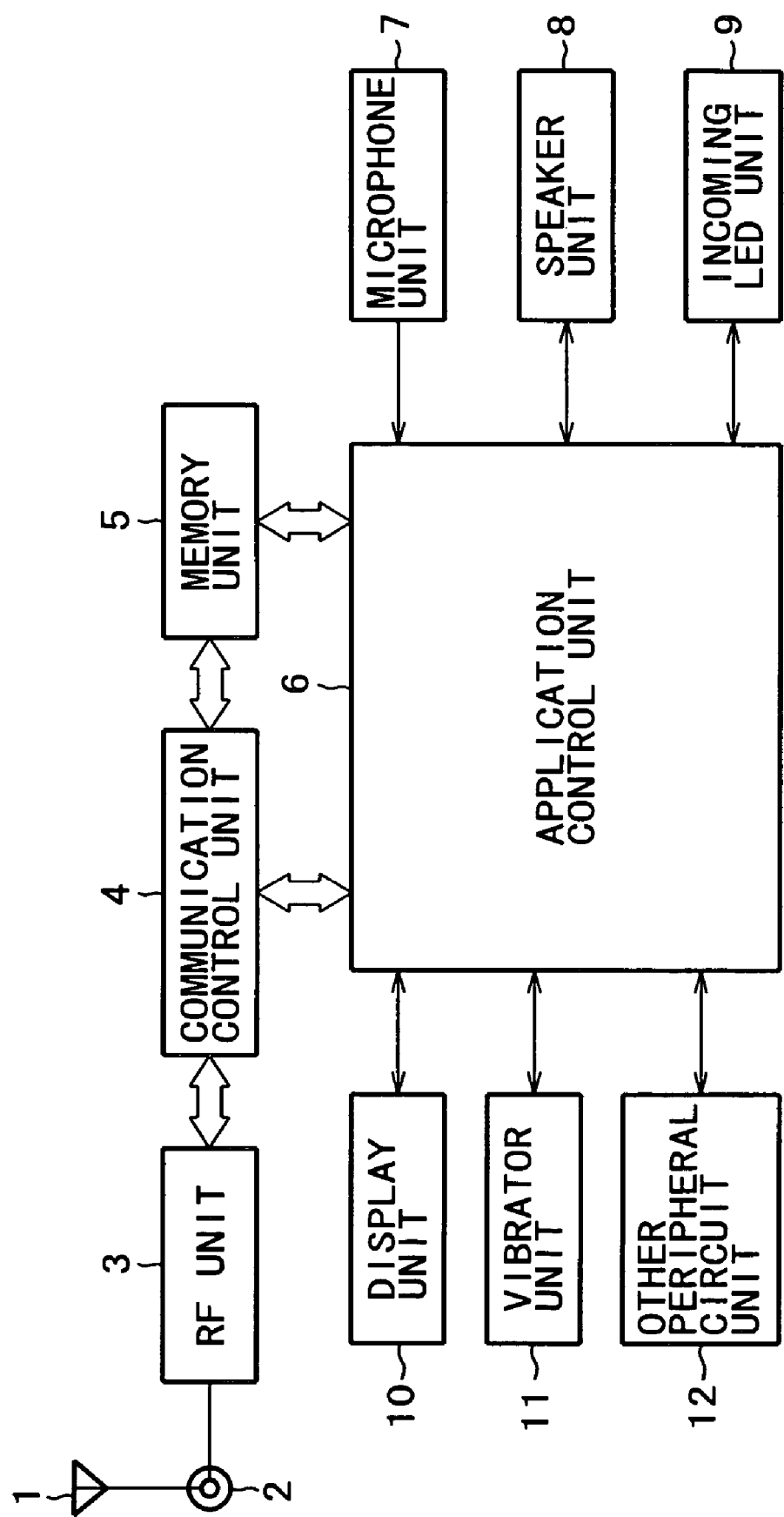
FIG. 3 is a block diagram of an embodiment of a mobile communication terminal of this invention.

First, a configuration example of the mobile communication terminal in these embodiments will be described. FIG. 3 shows a block diagram of the whole DS-CDMA system mobile communication terminal in these embodiments. The DS-CDMA system mobile communication terminal is composed of an antenna 1, an antenna connector end 2, an RF unit 3, a communication control unit 4, a memory unit 5, an application control unit 6, a microphone unit 7, a speaker unit 8, an incoming light emitting diode (LED) unit 9, a display unit 10, a vibrator unit 11 and the other peripheral circuit unit 12.

The RF unit 3 includes a transmission output circuit, a transmission signal modulation circuit, a reception processing unit, and a reception signal demodulation circuit. The RF unit 3 performs the high frequency processing of a transmission signal and a reception signal. That is, the RF unit 3 modulates a signal to be transmitted from the communication control unit 4 with the transmission signal modulation circuit, and performs the power amplification of the modulated signal to a predetermined transmission power output level with the transmission output circuit to transmit the amplified signal from the antenna 1 to a base station.

Moreover, a reception signal obtained by the antenna 1 is demodulated by the reception signal demodulation circuit of the RF unit 3, and is supplied to the communication control unit 4. Then, the reception signal is now stored in the memory unit 5, or is now emitted as a sound from the speaker unit 8 through the application control unit 6.

When the application control unit 6 detects an arrival of a signal, the application control unit 6 now lights the incoming LED unit 9, and now emits an arrival sound of the signal with the speaker unit 8, and further now produces vibrations with the vibrator unit 11. The application control unit 6 thereby informs a user of the arrival of the signal. Moreover, the application control unit 6 displays character information and image information on the display unit 10 according to a reception signal or operation input by a user.

[Descriptions of the Transmission Output Circuit]

Figure 1:
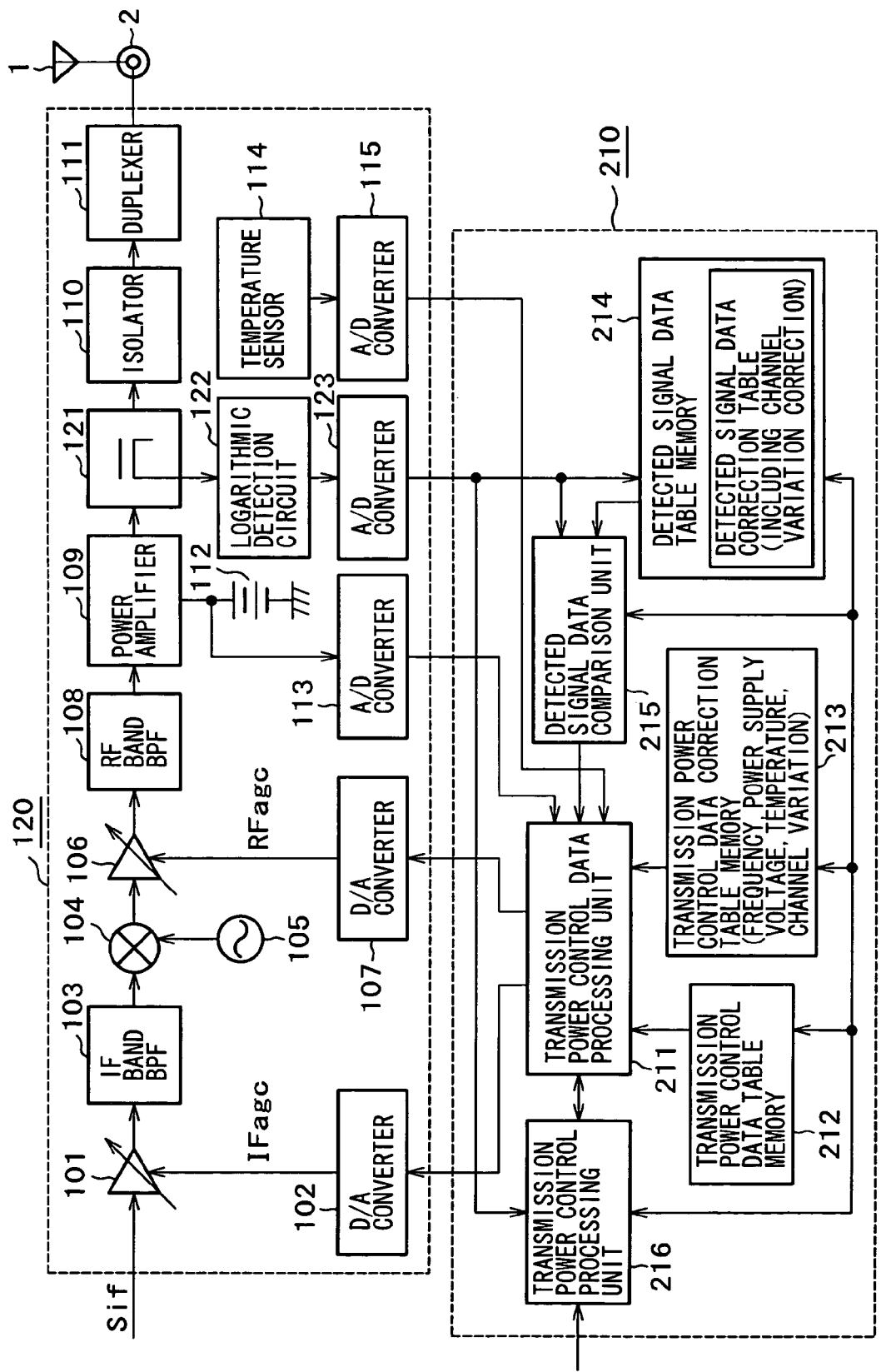
FIG. 1 is a block diagram of an embodiment of a transmission output circuit according to this invention.

Next, an embodiment of the transmission output circuit included in the RF unit 3 is explained. FIG. 1 is a block diagram showing an example of the transmission output circuit of the DS-CDMA system mobile communication terminal of these embodiments. Similarly to the above-mentioned conventional example of FIG. 13, the transmission output circuit is composed of a transmission signal processing system 120 and a transmission power control system 210.

[Descriptions of the Transmission Signal Processing System]

Figure 13:
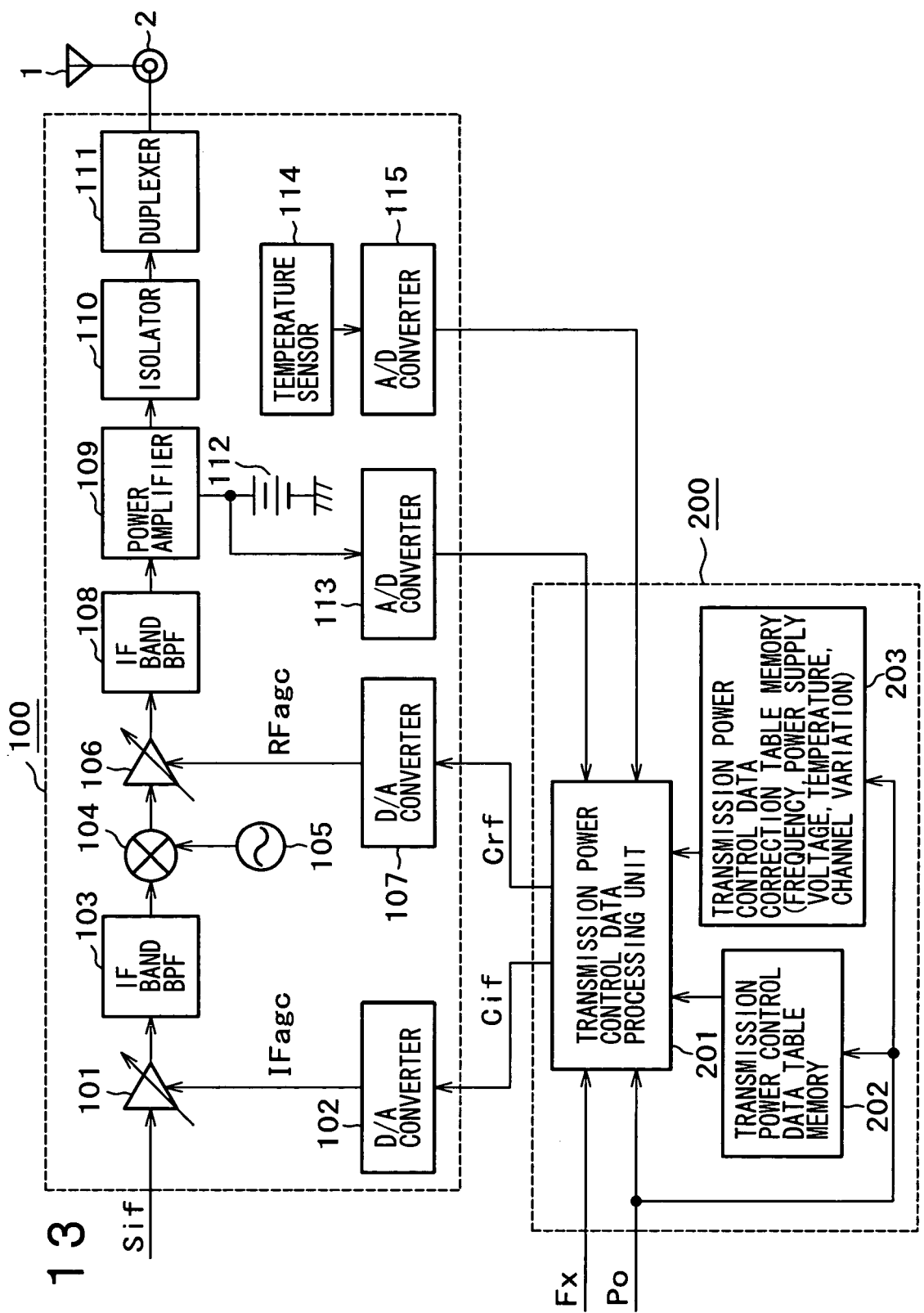
FIG. 13 is a block diagram showing an configuration example of a conventional transmission output circuit.
Figure 14:
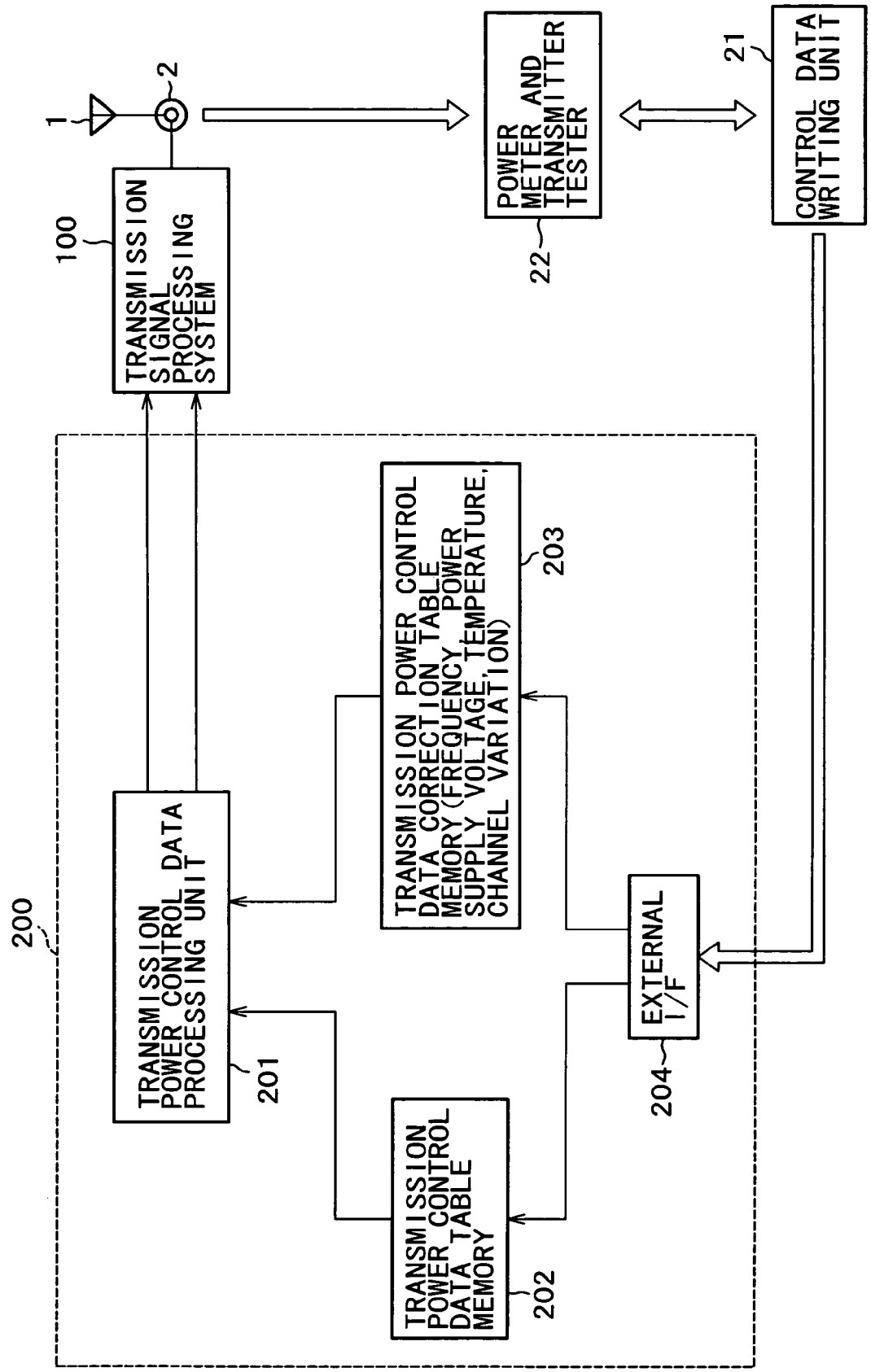
FIG. 14 is a diagram for explaining a table data writing method in the conventional transmission output circuit.

In the transmission signal processing system 120, each unit same as one in the above-mentioned transmission signal processing system 100 of FIG. 13 is designated by the same reference numeral as one in the transmission signal processing system 100, and the description of the unit is hereupon omitted. This embodiment is provided with a directional coupler 121 between a power amplifier 109 and an isolator 110. A part of a transmission output signal which is amplified to a predetermined electric power by the power amplifier 109 is supplied to a logarithmic detection circuit 122 through the directional coupler 121.

The logarithmic detection circuit 122 is a circuit capable of obtaining a detection voltage varying linearly corresponding to the level (dBm value) of an input signal. As the logarithmic detection circuit 122, the one which has a remarkably superior linearity and to which a temperature compensation is applied is used. The detected voltage by the logarithmic detection circuit 122 is converted to digital data by an A/D converter 123, and then is transmitted to a transmission power control system 210.

Figure 4:
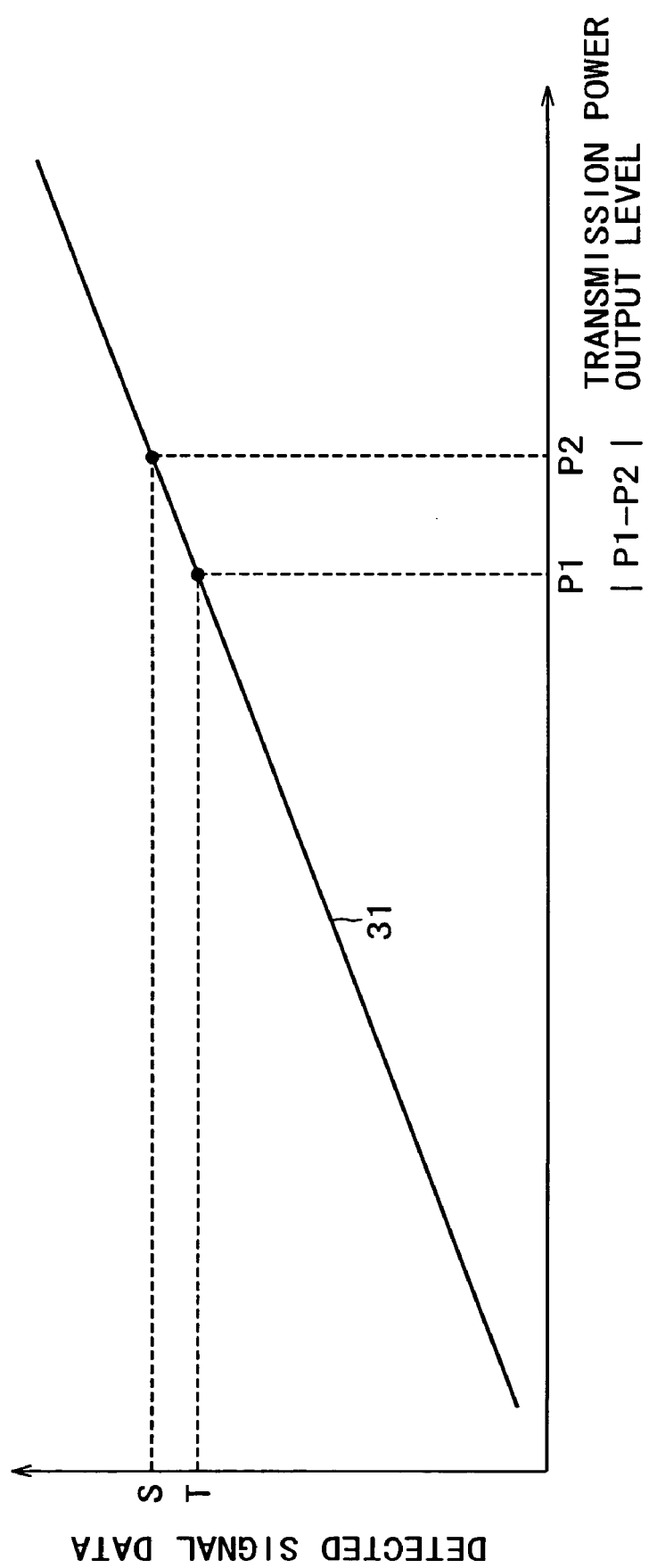
FIG. 4 is a diagram for explaining a characteristic of a detection circuit to be used in the transmission output circuit of the embodiment.

FIG. 4 shows a characteristic of detected signal data from the A/D converter 123 relative to transmission power output levels. As also shown in this FIG. 4, as the logarithmic detection circuit 122, the one to which the temperature compensation is applied and which has a remarkably superior linearity is used.

The other configurations of the transmission signal processing system 120 are made to be quite the same as those of the above-mentioned transmission signal processing system 100.

[Descriptions of Configuration of the Transmission Power Control System]

The transmission power control system 210 as transmission power control data generation means in this embodiment includes a detected signal data table memory 214 for storing a detected signal data table, a detected signal data comparison unit 215 and a transmission power control processing unit 216 in addition to a transmission power control data processing unit 211, a transmission power control data table memory 212 for storing a transmission power control data table, and a transmission power control data correction table memory 213 for storing a transmission power control data correction table. The transmission power control data processing unit 211 and the transmission power control processing unit 216 are severally configured by a DSP in this embodiment.

As the transmission power control data correction table to be stored in the transmission power control data correction table memory 213 in this embodiment, the number of multiplexed channels as well as temperature changes, power supply voltage changes and transmission frequencies are used as environmental condition parameters. The correction data of the transmission power control data pertaining to these four kinds of environmental condition parameters are produced at the stage of the designing and/or the developing of the transmission output circuit or the mobile communication terminal, and are written into the transmission power control data correction table memory 213 in the way which will be described later.

The detected signal data which can be obtained from the corresponding logarithmic detection circuit 122 when the output level of the power amplifier 109 becomes a target transmission power output level is written in the detected signal data table memory 214 as the detected signal data table. Moreover, the information of the detected signal data correction table is also written in the detected signal data table memory 214.

As to the information of the detected signal data correction table, because the logarithmic detection circuit 122 is a circuit which can obtain temperature compensated detection voltages changing remarkably linearly, two kinds of the environmental condition parameters of the transmission frequency and the number of multiplexed channels are used. The detected signal data correction data of these two kinds of parameters is produced at the stage of the designing and/or the stage of the development of the transmission output circuit or the mobile communication terminal, and is written into the detected signal data table memory 214 in the way described as follows.

Figure 2:
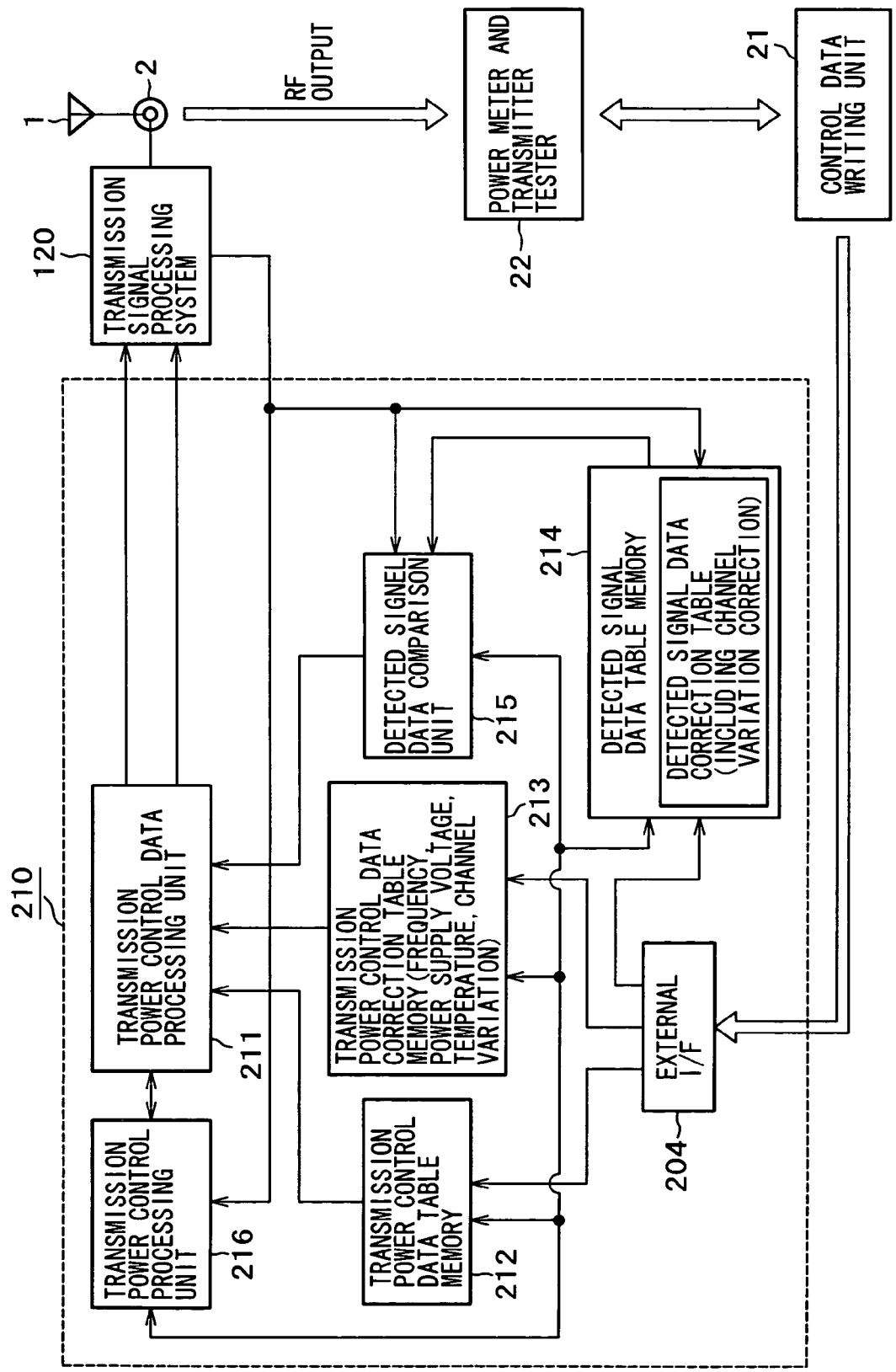
FIG. 2 is a view for explaining a table data writing method in the transmission output circuit of the embodiment.

FIG. 2 is a block diagram for explaining a table data writing method into the memories 212, 213 and 214 at the time of the mass production of the DS-CDMA system mobile communication terminal in this embodiment.

As shown in FIG. 2, first, the information of the transmission power control data correction table produced at the designing stage and/or the development stage in advance as described above is written into the transmission power control data correction table memory 213, and the information of the detected signal data correction table is written into the detected signal data table memory 214 by means of the control data writing unit 21 on the adjustment line at the time of the mass production of the DS-CDMA system mobile communication terminal.

Next, a target transmission power output level is supposed. While the RF band transmission signal output from the antenna connector end 2 is monitored by the power meter and transmitter tester 22, the transmission power control data is adjusted in order that the RF band transmission signal output may take the target transmission power output level. When the RF band transmission signal output from the antenna connector end 2 takes the target transmission power output level, the transmission power control data is written into the transmission power control data table memory 212 as the transmission power control data corresponding to the target transmission power output level.

Moreover, when the RF band transmission signal output from the antenna connector end 2 takes the target transmission power output level, the detected signal data which is the detected signal of the logarithmic detection circuit 122 digitized by the A/D converter is written into the detected signal data table memory 214 as the detected signal data corresponding to the target transmission power output level.

The above-mentioned processing operation is performed to all of the values of the necessary target transmission power output level, and the transmission power control data table is written into transmission power control data table memory 212. Moreover, the detected signal data table is written into the detected signal data table memory 214.

At the time of the writing, the ambiance temperature, the voltage of the power supply 112, the transmission frequency of the RF band transmission signal, the number of multiplexed channels, and the like at the time of the writing of the transmission power control data table and the detected signal data table into the memories 212 and 214 are set in the transmission power control data processing unit 211 as the standard parameter information. Moreover, the standard parameter information of the transmission frequency and the number of multiplexed channels is written into the detected signal data table.

By the processing processes described above, in the transmission output circuit of the DS-CDMA system mobile communication terminal, the transmission power control data and the detected signal data, both corresponding to the RF output level intended to be transmitted, and the transmission power control data correction data and the detected signal data correction data, both related to the environmental condition parameters, are previously written in the memories 212, 213 and 214 as the tables at the time of the mass production.

Incidentally, although the power supply voltage is not used as a parameter pertaining to the information of the detected signal data correction table hereupon, it is of course possible to also add the power supply voltage to the parameters, and to produce the detected signal data correction data, and thereby to refer to the value of the power supply voltage from the A/D converter 113 at an actual use time for also dealing with the changes of the power supply voltage of the detected signal data.

Next, a transmission power control processing unit 216 is one for performing the control of the operation and the processing of each unit in the transmission power control system 210. In the mobile communication terminal of this embodiment, the mode of the open loop transmission power control and the mode of the closed loop transmission power control can be suitably switched to perform as the transmission power control method. In the mode of the open loop transmission power control, the mobile communication terminal itself variably controls the transmission power according to the reception field level of the reception signal from the base station. In the mode of the closed loop transmission power control, the transmission power is variably controlled on the basis of the TPC control from the base station.

The communication control unit 4 transmits an instruction of whether the open loop transmission power control mode is selected or whether the closed loop transmission power control mode is selected to the transmission power control processing unit 216. The communication control unit 4 transmits the instruction signal of the transmission power output level based on the reception electric field intensity at the time of the open loop transmission power control mode. The communication control unit 4 transmits the instruction signal of the transmission power output level based on the received TPC data at the time of the closed loop transmission power control mode.

Moreover, the communication control unit 4 supplies the information of the transmission frequency and the number of multiplexed channels to the transmission power control processing unit 216.

Then, the transmission power control processing unit 216 controls the selection of the control modes of the transmission power control system 210 concerning whether to select the open loop transmission power control mode or to select the closed loop transmission power control mode. The transmission power control processing unit 216 controls each unit of the transmission power control system 210 on the basis of the instruction signal of the transmission power output level based on the TPC data, the instruction signal of the transmission power output level based on the reception electric field intensity, and the information of the transmission frequency and the number of multiplexed channels at that time. Thereby, the transmission power control processing unit 216 executes the transmission power control in order that the transmission power output level may take the instructed target transmission power output level.

Moreover, in this embodiment, the detected signal data from the A/D converter 123 is also supplied to the transmission power control processing unit 216. The transmission power control processing unit 216 monitors the transmission power level of the transmission signal from the power amplifier 109 on the basis of the detected signal data. Thereby, the transmission power control processing unit 216 prevents that the transmission power output level takes a value outside of the range of the fixed standard values to cause the problems described at the beginning.

That is, for example, if the transmission power output level is increased in accordance with an instruction of the TCP command from the base station in the case where the instruction of the TCP command is one for increasing the transmission power output level when the present transmission power output level is the maximum transmission power output level of the standard values or a level in the vicinity of the maximum transmission power output level in the closed loop transmission power control mode, then the transmission power output level becomes a large level outside of the standard range. Consequently, the problem in which transmission signals from other user terminals are masked and there is a fear that the decrease of the cell capacity is brought about is caused.

Moreover, if the transmission power output level is increased in accordance with the instruction of a TCP command from the base station in the case where the instruction of the TCP command is one for decreasing the transmission power output level when the present transmission power output level is the minimum transmission power output level of the standard values or a level in the vicinity of the minimum transmission power output level in the closed loop transmission power control mode, then the transmission power output level becomes a small level outside of the standard range. Consequently, there is the possibility of the generation of the problem in which up link signal from a mobile communication terminal does not reach the base station in a fringe area of the cell.

In view of these problems, in this embodiment, the transmission power control processing unit 216 monitors the transmission power output level of the power amplifier 109 on the basis of detected signal data. When the problems mentioned above are generated in the closed loop transmission power control mode, this embodiment includes the function of controlling for preventing that the transmission power output level is outside of the standard range while ignoring the TCP command.

Next, the transmission power control system 210 of this embodiment controls the transmission power output level, which is controlled in accordance with the feed forward control, to the target transmission power output level by the use of the detected signal data from the A/D converter 123 and the data of the detected signal data table in the detected signal data table memory 214.

The detected signal data comparison unit 215 is the one for the control as mentioned, and compares the present detected signal data from the A/D converter 123 with the detected signal data at the time of the target transmission power output level from the detected signal data table memory 214, and supplies the comparison difference output to the transmission power control data processing unit 211.

As will be described later, the comparison processing operation of the detected signal data comparison unit 215 is controlled to be turned on or off by the transmission power control processing unit 216 in this example. In the case where the detected signal data comparison unit 215 is turned on by the transmission power control processing unit 216 to perform the comparison processing operation, the transmission power control is accompanied by the loop control based on the detected signal data in addition to the feed forward control. This loop control is called as self loop transmission power correction control in the following.

Moreover, when the detected signal data comparison unit 215 is turned off by the transmission power control processing unit 216, the detected signal data comparison unit 215 stops the comparison processing operation, and outputs, for example, "0" to the transmission power control data processing unit 211 as a comparison difference output. At this time, in the transmission power control system 210, the transmission power control by the feed forward system similar to the conventional caser in FIG. 13 described as above is performed. Incidentally, in this embodiment, the respect of the performance of the correction of the transmission power control data based on the number of multiplexed channels is different from the conventional case in FIG. 13 described as above.

While the transmission power control data processing unit 211 receives the control of the transmission power control processing unit 216, the transmission power control data processing unit 211 generates the transmission power control data by processing using the transmission power control data table of the transmission power control data table memory 212 and the transmission power control data correction table of the transmission power control data correction table memory 213. Moreover, when the comparison difference output of the detected signal data comparison unit 215 is not within a fixed error permissible value range determined according to the standard values in advance, the transmission power control data processing unit 211 also carries out the control of correcting the transmission power control data in order that the comparison difference output of the detected signal data comparison unit 215 may take zero, that is, the above-mentioned self loop transmission power correction control.

Incidentally, as described above, the mobile communication terminal of this embodiment includes the closed loop transmission power control mode in which the transmission power is controlled by means of the TCP command from the base station, and the open loop transmission power control mode in which the transmission power is controlled according to the reception electric field intensity detected by the mobile communication terminal itself. If the self loop transmission power correction control using the above-mentioned detected signal data is performed while the closed loop transmission power control is performed, then doubled loop controls are to be performed, and there is a fear that the defect such as the occurrence of inconsistency (incongruence) of the control direction of respective loop control and the like is caused. Accordingly, in this embodiment, only in case of the open loop transmission power control, the self loop transmission power correction control is performed in addition. The on-off switching control of the self loop transmission power correction control therefor is performed by the transmission power control processing unit 216, as it will be described later.

[Descriptions of the Transmission Power Control Operation]

In the transmission power control system 210 configured as described above, the transmission power control which will be described in the following is performed in accordance with the control of the transmission power control processing unit 216. That is, FIG. 5 and FIG. 6 which is the continuation thereof are flowcharts for explaining the transmission power control operation in this embodiment. The processing operation of FIG. 5 and FIG. 6 mainly shows the control processing of the transmission power control processing unit 216 and the control processing of the transmission power control data processing unit 211 under the control of the transmission power control processing unit 216.

First, the transmission power control processing unit 216 judges whether the open loop transmission power control mode should be selected or whether the closed loop transmission power control mode should be selected on the basis of the instruction from the communication control unit 4 (Step S101).

When the transmission power control processing unit 216 judges that the open loop transmission power control mode is selected at Step S101, the transmission power control processing unit 216 transmits an instruction indicating that the open loop transmission power control mode is selected to the transmission power control data processing unit 211, and turns on the self loop transmission power correction control. In this example, the transmission power control processing unit 216 controls the detected signal data comparison unit 215 to turn on (Step S102).

Then, the transmission power control processing unit 216 determines a target transmission power output level, that is, a transmission power output level of the transmission signal intended to be transmitted, based on the reception electric field intensity from the communication control unit 4. Then, the transmission power control processing unit 216 controls the transmission power control data table memory 212 to extract the transmission power control data corresponding to the determined transmission power output level of the transmission signal intended to be transmitted from the transmission power control data table, and to supply the extracted transmission power control data to the transmission power control data processing unit 211.

Thereby, the transmission power control data processing unit 211 obtains the necessary set of the IF band AGC transmission power control data and the RF band AGC transmission power control data from the transmission power control data table of the transmission power control data table memory 212 (Step S103).

Next, the transmission power control processing unit 216 supplies the information of the transmission frequency and the number of multiplexed channels instructed by the communication control unit 4 to the transmission power control data processing unit 211. Then, the transmission power control data processing unit 211 refers to the present power supply voltage from the A/D converter 113, the present temperature information from the A/D converter 115, and the present information of the transmission frequency and the number of multiplexed channels from the transmission power control processing unit 216, and the transmission power control data processing unit 211 recognizes the difference of these environmental condition parameters from the standard information at the time when the transmission power control data table is written in the transmission power control data table memory 212.

Then, on the basis of the difference, the transmission power control data processing unit 211 corrects the IF band AGC transmission power control data and the RF band AGC transmission power control data obtained from the transmission power control data table so as to be the transmission power control data corresponding to the present environmental condition parameters by the use of the information of the transmission power control data correction table of the transmission power control data correction table memory 213, and the transmission power control data processing unit 211 outputs the corrected IF band AGC transmission power control data and the RF band AGC transmission power control data to the transmission signal processing system 120 (Step S104). The correction of the transmission power control data in this case is the processing of the addition or the subtraction of the correction data from the correction table to the transmission power control data.

In the transmission signal processing system 120, the IF band AGC transmission power control data and the RF band AGC transmission power control data from the transmission power control system 210 are converted to the IF band transmission signal AGC voltage IFagc and the RF band transmission signal AGC voltage RFagc by the D/A converters 102 and 107 to be supplied to the IF band AGC amplifier 101 and the RF band AGC amplifier 106, respectively. Then, the gain control to a transmission signal is performed, and the power of the resulted transmission signal is amplified by the power amplifier 109.

Then, the output of the power amplifier 109 is detected by the logarithmic detection circuit 122, and is converted to the detected signal data by the A/D converter 123 to be supplied to the transmission power control system 210.

On the other hand, the transmission power control processing unit 216 controls the detected signal data table memory 214 to supply the detected signal data corresponding to the target transmission power output level of the transmission signal instructed by the communication control unit 4 to the detected signal data comparison unit 215. At this time, the transmission power control processing unit 216 controls the detected signal data table memory 214 to correct the detected signal data on the basis of the correction data at the time of the transmission frequency and the number of multiplexed channels instructed by the communication control unit 4 in the detected signal data correction table stored in the detected signal data table memory 214, and to supply the corrected detected signal data to the detected signal data comparison unit 215. The correction of the detected signal data in this case is the processing of the addition or the subtraction of the correction data from the correction table to the detected signal data.

Then, in the open loop transmission power control mode, as described above, because the detected signal data comparison unit 215 is turned on, the detected signal data comparison unit 215 supplies the comparison difference output of the detected signal data corresponding to the present transmission power output level with the detected signal data corresponding to the target transmission power output level read from the detected signal data table memory 214 to the transmission power control data processing unit 211.

Then, the transmission power control data processing unit 211 examines the comparison difference output from the detected signal data comparison unit 215 (Step S105), and judges whether the comparison difference output is within the previously determined error permissible value range or not (Step S106).

When the comparison difference output is not within the error permissible value range at Step S106, the transmission power control data processing unit 211 performs the further correction operation of the transmission power control data corrected on the basis of the correction data from the correction table in the transmission power control data correction table memory 213 in order that the comparison difference output may be zero according to the magnitude of the comparison difference output (Step S107). Then, the control processing returns to Step S101.

As an example of the correction operation of the transmission power control data according to the magnitude of the comparison difference output at Step S107, for example, a correction control method of a plurality of stages according to the magnitude of the comparison difference output can be used. For example, in case of two stages, when the comparison difference output is not within the error permissible value range but the magnitude of the comparison difference output is relatively small, the correction of the transmission power control data is performed per, for example, one dB by the self loop transmission power correction control. Moreover, when the magnitude of the comparison difference output which is not in the error permissible value range is relatively large, the correction of the transmission power control data is executed per, for example, three dB by the self loop transmission power correction control.

Figure 7:
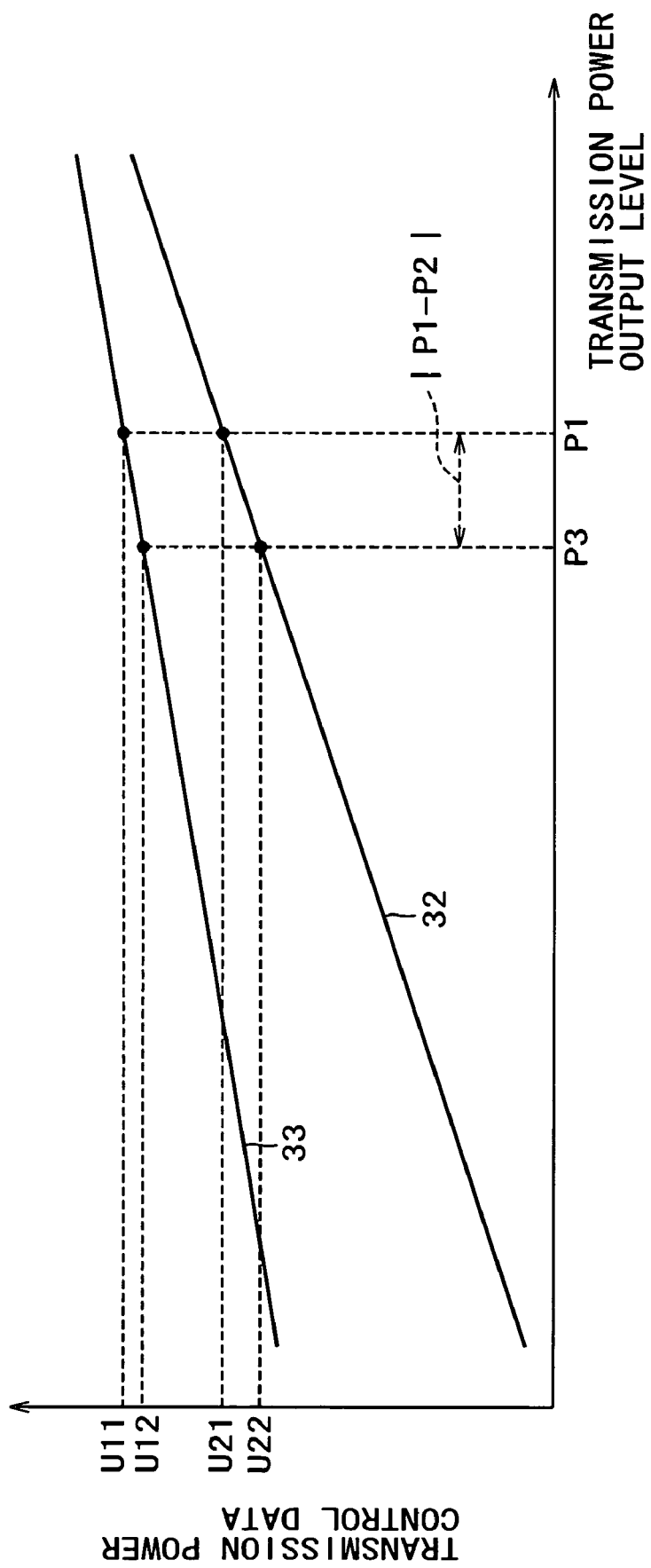
FIG. 7 is a characteristic diagram for explaining the control processing operation of the transmission power output level in the mobile communication terminal of the embodiment.

Hereupon, the characteristic diagrams of FIG. 4 and FIG. 7 are referred to while the self loop transmission power correction control is further described.

A straight line 31 in FIG. 4 indicates the characteristic of detected signal data to the transmission power output levels of the output signals from the power amplifier 109. As described above, the straight line 31 indicates the characteristic of the logarithmic detection circuit 122. Moreover, straight lines 32 and 33 in FIG. 7 indicate the relationships of the transmission power output levels to the transmission power control data. The straight line 32 is the characteristic of the IF band AGC amplifier 101, and the straight line 33 is the characteristic of the RF band AGC amplifier 106. Incidentally, because the correction table values based on the frequency, the power supply voltage, the temperature and the number of multiplexed channels are, as described above, operated by being offset to the transmission power control data simply, the correction table values are considered to be neglected for simplifying consideration here.

Now, for example, it is supposed that the target transmission power output level is P1 [dBm], and the actually transmitted transmission power output level is P2 [dBm], and further the detected signal data corresponding to the level P1 is designated by T, and the detected signal data corresponding to the level P2 is designated by S. Hereupon, if it is supposed that P2 is larger than P1, then the difference of the detected signal data corresponding to (S−T) bits is generated in the detected signal data comparison unit 215 as shown in FIG. 4. The difference of the detected signal data indicates the electric power difference of |P1−P2| [dB].

That is, the fact indicates the following. Namely, because, when the target transmission power output level is supposed to be P1 [dBm], because the actually transmitted transmission power output level is P2, as shown on FIG. 7, the transmission power control data at that time is U11 for the IF band AGC transmission power control data, and is U21 for the RF band AGC transmission power control data. However, at these transmission power control data U11 and U21, the actual transmission power output level is, as a result, P2, which is larger than the target transmission power output level P1.

Accordingly, if the value obtained by subtracting the electric power difference of |P1−P2| [dB] from the target transmission power output level P1 [dBm] is supposed to be P3 [dBm] in FIG. 7, then the transmission power output level P3 is set as the target transmission power output level, and the RF band AGC transmission power control data and the IF band AGC transmission power control data at that time are set. Then, as shown in FIG. 7, the RF band AGC transmission power control data is set to be U12, and the IF band AGC transmission power control data is set to be U22. Thereby, the transmission power output level is set to be the target transmission power output level P1 [dBm].

In the way described as above, in this embodiment, in the open loop transmission power control mode, even if the initial transmission power output level is deviated from the target transmission power output level value, it becomes possible to keep an accurate transmission power output level to the target value after second time or more of the control.

Incidentally, because the detected signal data for comparison does not exist to the initial transmission power output level after the beginning of transmission operation, similarly to the transmission power control of the conventional feed forward system, only the correction table value in each of the environmental condition parameters and the previously written transmission power control data are used. Thereby, the transmission power control data regarded as the optimum is operated and generated in the transmission power control data processing unit 211.

When the transmission power control data processing unit 211 judges that the comparison difference output is within the error permissible value range at Step S106, the transmission power control data processing unit 211 does not perform the self loop transmission power correction control, and the control processing returns to Step S101. Consequently, in this case, the transmission power control data processing unit 211 is in the state of supplying the transmission power control data generated at Step S103 to the transmission signal processing system 120.

That is, if the above-mentioned example referring to the FIG. 4 and FIG. 7 is applied, in the case where the electric power difference |P1−P2| [dB] is within the predetermined standard value range to the target transmission power output level, the correction operation based on the detected signal data is not performed, but the transmission power control of the feed forward system similar to the conventional control is performed, and thereby the quick frequent changes of the transmission power output level can be prevented.

Next, when the transmission power control processing unit 216 judges that the closed loop transmission power control mode is selected by the instruction from the communication control unit 4 at Step S101, the transmission power control processing unit 216 informs the transmission power control data processing unit 211 of the selection of the closed loop transmission power control mode, and the transmission power control processing unit 216 turns off the self loop transmission power correction control (Step S108). In this example, the detected signal data comparison unit 215 is made to be off.

Figure 6:
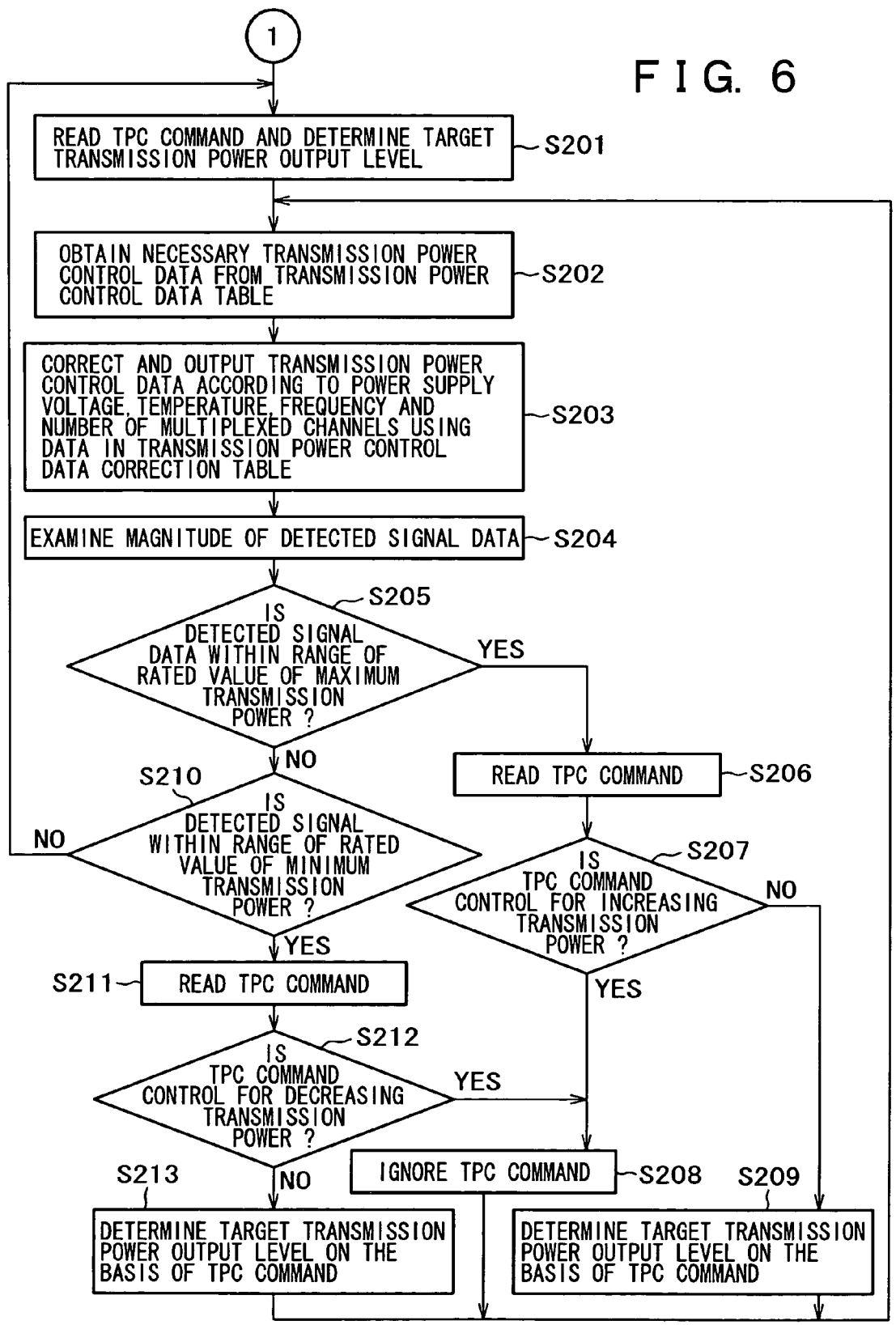
FIG. 6 is a diagram showing a part of the flowchart for explaining the control processing operation of the transmission power output level in the mobile communication terminal of the embodiment.

Then, the transmission power control processing unit 216 reads a TPC command from the communication control unit 4, and determines the transmission power output level of the transmission signal intended to be transmitted on the basis of the TCP command (Step S201 in FIG. 6).

Then, the transmission power control processing unit 216 controls the transmission power control data table memory 212 to extract the transmission power control data corresponding to the transmission power output level of the determined transmission signal intended to be transmitted form the transmission power control data table to supply the extracted transmission power control data to the transmission power control data processing unit 211. Thereby, the transmission power control data processing unit 211 obtains the necessary IF band AGC transmission power control data and the RF band AGC transmission power control data from the transmission power control data table of the transmission power control data table memory 212 (Step S202).

Next, the transmission power control processing unit 216 transmits the information of the transmission frequency and the number of multiplexed channels instructed by the communication control unit 4 to the transmission power control data processing unit 211. The transmission power control data processing unit 211 refers to the present power supply voltage from the A/D converter 113, the present temperature information from the A/D converter 115, and the present information of the transmission frequency and the number of multiplexed channels from the transmission power control processing unit 216, and recognizes the difference of these parameters from the standard information at the time when the transmission power control data table is written in the transmission power control data table memory 212.

Then, on the basis of the difference, the transmission power control data processing unit 211 corrects the IF band AGC transmission power control data and the RF band AGC transmission power control data obtained from the transmission power control data table so as to be the transmission power control data corresponding to the present parameters by the use of the information of the transmission power control data correction table of the transmission power control data correction table memory 213, and outputs the corrected IF band AGC transmission power control data and the RF band AGC transmission power control data to the transmission signal processing system 120 (Step S203). The correction of the transmission power control data in this case is the processing of the addition or the subtraction of the correction data from the correction table to the transmission power control data.

In the transmission signal processing system 120, the IF band AGC transmission power control data and the RF band AGC transmission power control data from the transmission power control system 210 are converted to the IF band transmission signal AGC voltage IFagc and the RF band transmission signal AGC voltage RFagc by the D/A converters 102 and 107 to be supplied to the IF band AGC amplifier 101 and the RF band AGC amplifier 106, respectively. Then, the gain control to a transmission signal is performed, and the power of the resulted transmission signal is amplified by the power amplifier 109.

Then, the output of the power amplifier 109 is detected by the logarithmic detection circuit 122, and is converted to the detected signal data by the A/D converter 123 to be supplied to the transmission power control system 210.

Then, in the closed loop transmission power control mode, as described above, the detected signal data comparison unit 215 of the transmission power control system 210 is turned off, and the above-mentioned self loop transmission power correction control is not performed. Instead, the control using the detected signal data in order that the transmission power output level may not take a value larger than the maximum value of the standard values or a value smaller than the minimum value of the standard values is performed in the transmission power control processing unit 216 as follows.

Figure 8:
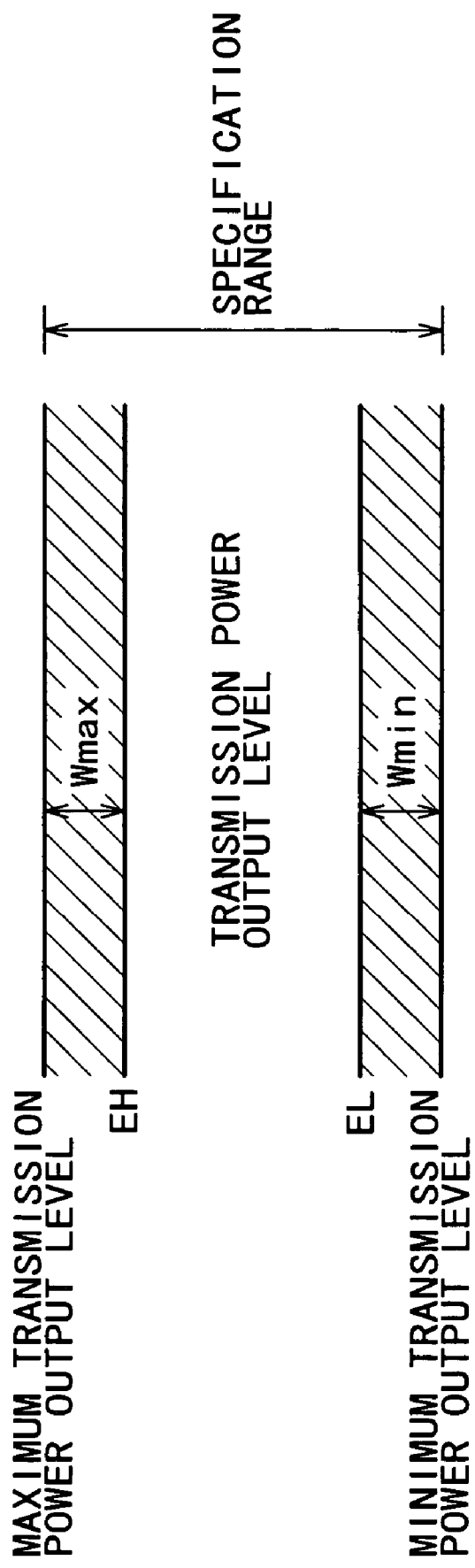
FIG. 8 is a view to be used for the illustration of the control processing operation of the transmission power output level in the mobile communication terminal of the embodiment.

First, the transmission power control processing unit 216 examines the magnitude of the detected signal data from the A/D converter 123 (Step S204). Then, the transmission power control processing unit 216 judges whether the detected signal data is within the previously determined the range of the standard values of the maximum transmission power Wmax (see FIG. 8) or not (Step S205).

Hereupon, the range of the standard values of the maximum transmission power Wmax is a range indicating that the transmission power output level is the maximum value (the maximum transmission power output level) of the standard range of the transmission power output level or in the vicinity of the maximum value, and that, if the transmission power output level is increased, there is a fear that the transmission power output level exceeds the standard range of the transmission power. As shown by oblique lines in FIG. 8, the range of the standard values of the maximum transmission power Wmax is set as the level range Wmax between the maximum transmission power output level and the transmission power output level EH which is lower than the maximum transmission power output level by the degree of a predetermined level. In this embodiment, the range of the standard values of the maximum transmission power Wmax is made to be possible to be changed by an arbitrary setting of a user by changing the level EH.

When the transmission power control processing unit 216 judges that the detected signal data is within the range of the standard values of the maximum transmission power Wmax at Step S205, the transmission power control processing unit 216 reads the next TPC command (Step S206), and judges whether the TPC command instructs the control in the direction of increasing the transmission power or not (Step S207).

Then, when the TPC command instructs the control of the direction of increasing the transmission power, the transmission power control processing unit 216 ignores the TPC command read at Step S206 (Step S208), and after that, the control processing returns to Step S202. Consequently, in this case, in the transmission power control system 210, the feed forward control based on the target transmission power output level in accordance with the preceding TPC command is continued, and it can be prevented that the transmission power output level becomes larger than the maximum level of the standard range.

Moreover, when the transmission power control processing unit 216 judges that the TPC command does not instruct the control of the direction increasing the transmission power at Step S207, the transmission power control processing unit 216 determines a new target transmission power output level on the basis of the TPC command read at Step S206 (Step S209), and after that, the control processing returns to Step S202, and the transmission power control processing unit 216 transmits the determined transmission power output level to the transmission power control data processing unit 211. Consequently, in this case, the closed loop transmission power control based on the new TPC command is executed.

Moreover, when the transmission power control processing unit 216 judges that the detected signal data is not within the range of the standard values of the maximum transmission power Wmax at Step S205, the transmission power control processing unit 216 judges whether the detected signal data is within the range of the standard values of the minimum transmission power Wmin (see FIG. 8) or not (Step S210).

Hereupon, the range of the standard values of the minimum transmission power Wmin is a range indicating that the transmission power output level is the minimum value (the minimum transmission power output level) of the standard range of the transmission power output level or in the vicinity of the minimum value, and that, if the transmission power output level is further decreased, there is a fear that the transmission power output level becomes outside of the standard range of the transmission power. As shown by oblique lines in FIG. 8, the range of the standard values of the minimum transmission power Wmin is set as the level range Wmin between the minimum transmission power output level and the transmission power output level EL which is higher than the minimum transmission power output level by the degree of a predetermined level. In this embodiment, the range of the standard values of the minimum transmission power Wmin is made to be possible to be changed by an arbitrary setting of a user by changing the level EL.

When the transmission power control processing unit 216 judges that the detected signal data is within the range of the standard values of the minimum transmission power Wmin at Step S210, the transmission power control processing unit 216 reads the next TPC command (Step S211), and judges whether the TPC command instructs the control in the direction of decreasing the transmission power or not (Step S212).

Then, when the TPC command instructs the control of the direction of decreasing the transmission power, the transmission power control processing unit 216 ignores the TPC command read at Step S216 (Step S208), and after that, the control processing returns to Step S202. Consequently, in this case, in the transmission power control system 210, the feed forward control based on the target transmission power output level in accordance with the preceding TPC command is continued, and it can be prevented that the transmission power output level becomes smaller than the minimum level of the standard range.

Moreover, when the transmission power control processing unit 216 judges that the TPC command des not instruct the control of the direction decreasing the transmission power at Step S207, the transmission power control processing unit 216 determines a new target transmission power output level on the basis of the TPC command read at Step S206 (Step S209), and after that, the control processing returns to Step S202, and the transmission power control processing unit 216 transmits the determined transmission power output level to the transmission power control data processing unit 211. Consequently, in this case, the closed loop transmission power control based on the new TPC command is executed.

In the way described above, in this embodiment, because the mobile communication terminal itself should ensure the correct transmission power output level at some degree in case of the open loop transmission power control, the mobile communication terminal detects the self station transmission power output level in addition to the feed forward transmission power control system. After that, the mobile communication terminal compares the value of the detected self station transmission power output level with the data of the detected signal data table which has been previously written on the adjustment line. When the values of both of them different from each other more than a tolerance, the mobile communication terminal performs the correction operation of the transmission power control data in order that the comparison error of the detected signal data may be zero. Consequently, the notable effect in which the assurance of the transmission power output level can be more surely performed than the prior art.

Moreover, in this embodiment, in the closed loop transmission power control mode, the self loop transmission power correction control is not executed. Consequently, there is no case in which the existence of doubled transmission power control loops breaks the operation of the system.

Moreover, in the above-mentioned embodiment, in the closed loop transmission power control mode, the output of the power amplifier is detected, and the detection output is monitored. Thereby, when the TPC command from the base station is an instruction making the transmission power output level to be the outside of the standard range of the transmission power output level in the vicinity of the maximum value of the standard range or in the vicinity of the minimum value of the standard range, the TPC command is set to be ignored. Consequently, it becomes possible to keep the transmission power output level within the standard range always.

Incidentally, the turning on or off of the self loop transmission power correction control is performed by the turning on or of f of the detected signal data comparison unit 215, respectively, in the example described above. However, it is also possible to perform the turning on or off of the self loop transmission power correction control by determining the use of the comparison difference output from the detected signal data comparison unit 215 in accordance with the control of the transmission power control processing unit 216 with the transmission power control data processing unit 211.

[Failure Detection Operation]

In this embodiment, it is possible to monitor the transmission power output level by detecting the output of the power amplifier 109. Consequently, by using the monitored output result, it is possible to detect the generation of a failure in the mobile communication terminal transmission output circuit as it will be described in the following. Hereinafter, the failure detection operation in this embodiment will be described.

First, a failure detection method in the case where the mobile communication terminal is operating in the open loop transmission power control will be described. The method detects a failure on the basis of whether an expected value of the detected signal data corresponding to the set of the IF AGC transmission power control data and the RF AGC transmission power control data is within a forecast normal operation range or not.

The transmission output characteristic as the total mobile communication terminal in the environmental changes of the frequency, the power supply voltage, the temperature and the like are almost uniquely determined by the characteristics of the configuration parts of the transmission signal processing system 100 such as the power amplifier 109, the RF band AGC amplifier 106, the IF band AGC amplifier 101 and the like, all used in the mobile communication terminal.

Figure 9:
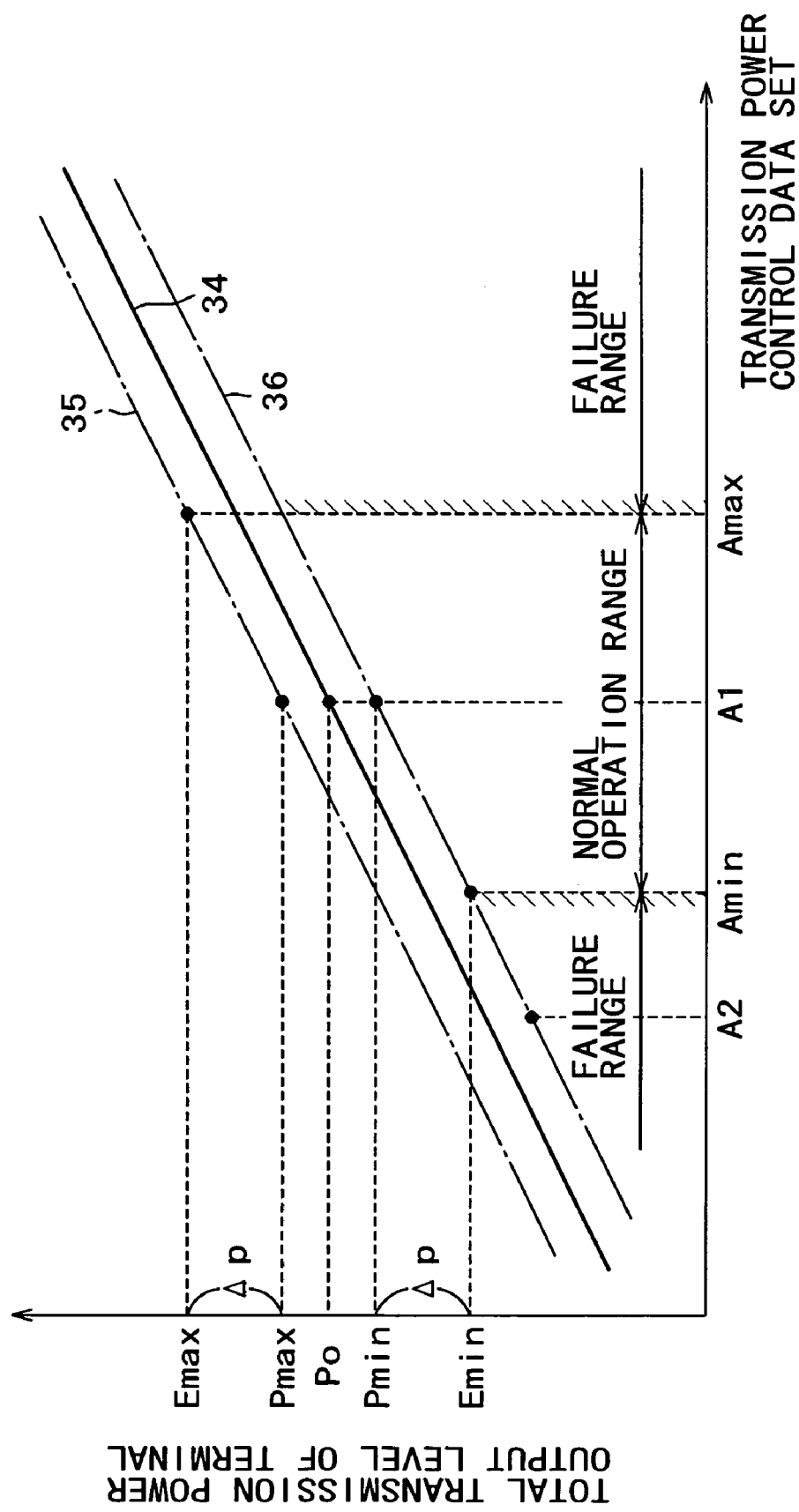
FIG. 9 is a diagram to be used for the illustration of failure detection operation in the mobile communication terminal of the embodiment.

Hereupon, if a pair of the IF AGC transmission power control data and the RF AGC transmission power control data is referred as a control data set, the relationship between the control data set and the total transmission power output level of the mobile communication terminal is the relationship as shown as the straight line 34 in FIG. 9.

Consequently, now, when A1 is set as the control data set as shown in FIG. 9, the total transmission power output level of the mobile communication terminal should be Po. However, it is necessary to add a predetermined range to the expected transmission power output level in consideration of the changes of the transmission power output level based on the changes of the frequency, the power supply voltage and the temperature.

Hereupon, as shown in FIG. 9, it is assumed that the upper limit value of the changes of the transmission power output level based on the frequency, the power supply voltage, the temperature changes, the number of multiplexed channels is one shown by an alternate long and short dash line 35 in FIG. 9. Moreover, it is also assumed that the lower limit value of the changes of the transmission power output level based on the frequency, the power supply voltage, the temperature changes, the number of multiplexed channels is one shown by an alternate long and short dash line 36 in FIG. 9. Then, when the transmission power output level changes, the maximum value thereof is Pmax, and the minimum value thereof is Pmin.

Since the things are as described above, as it is apparent from FIG. 9, when the transmission power control data processing unit 211 sets the control data set A1, it is expected that the total transmission power output level of the mobile communication terminal exists within the range of from Pmin to Pmax. Because there is the dispersion of individual parts actually, the quantity of a margin Δp of the dispersion is taken into consideration. Then, values Emax and Emin produced by adding the quantity of a margin Δp to Pmax and Pmin, respectively, are obtained. Consequently, it is possible to judge that the mobile communication terminal is normal when the total transmission power output level of the mobile communication terminal corresponding to the case where the control data set A1 is set exists in the range of from the value Emin to the value Emax.

Figure 10:
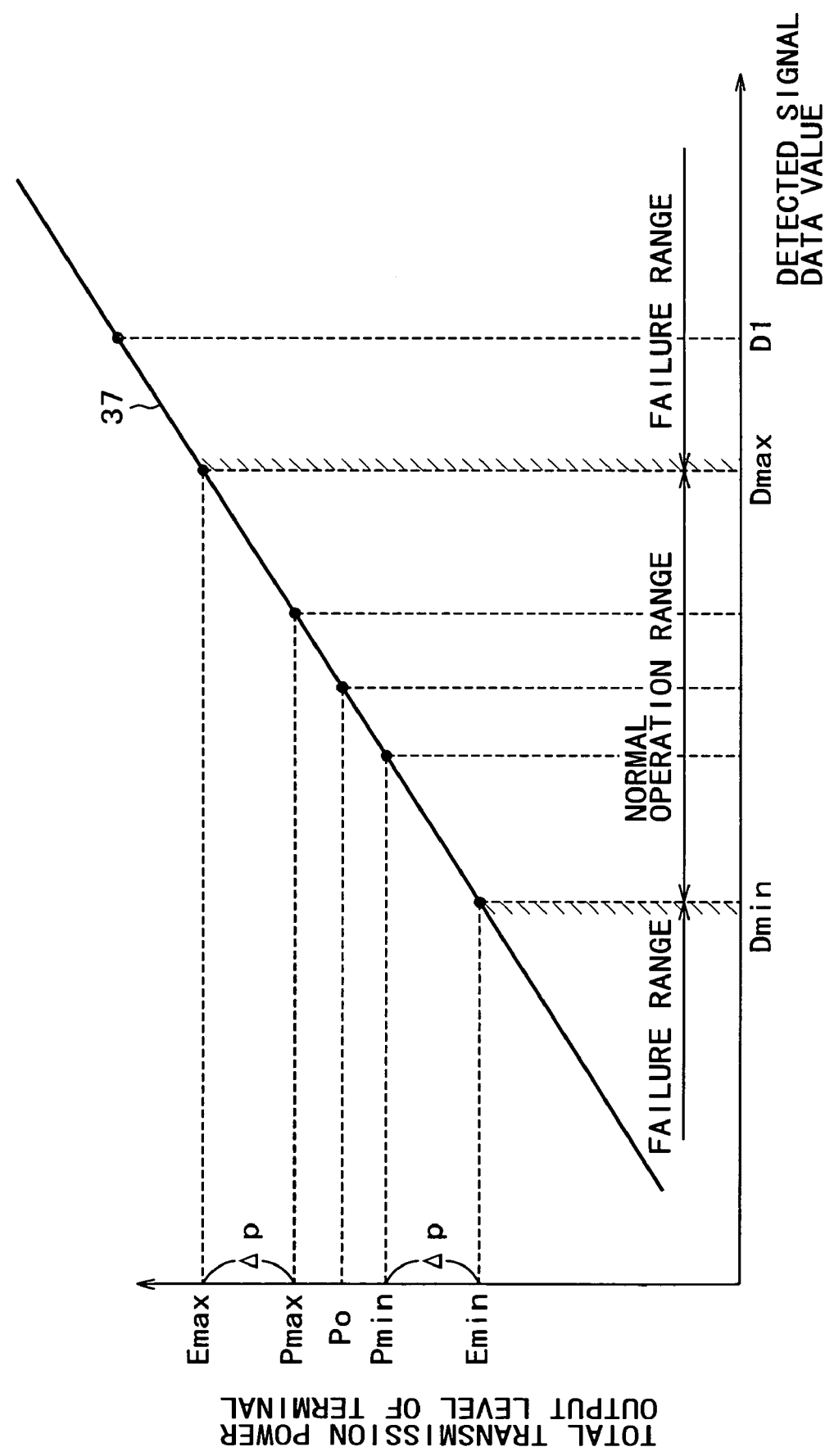
FIG. 10 is a diagram to be used for the illustration of the failure detection operation in the mobile communication terminal of the embodiment.

Next, the relationship between the detected signal data and the total transmission power output level of the mobile communication terminal is one shown by a straight line 37 in FIG. 10. Hereupon, because the logarithmic detection circuit 122 can compensate the frequency, the power supply voltage and the temperature, the normal level range of the detected signal data in the case where the transmission power control data set is set to be the control data set A1 is the range of from Dmin to Dmax as shown in FIG. 10 correspondingly to the normal rang of from the Emin to the Emax of the total transmission power output level of the mobile communication terminal.

In other words, when the detected signal data exists within the range of from Dmin to Dmax, the transmission output circuit of the mobile communication terminal can be considered that it is in a normally operating state.

If the detected signal data in the case where the control data set is set to be A1 is D1 shown in FIG. 10, the detected signal data deviates from the normal operation range, and the detected signal data apparently shows an abnormal value to the designed standard output value. That is, in this case, it can be judged that some trouble is produced in the parts of the transmission signal processing system.

Hereupon, as for the normal operation range and the failure operation range in FIG. 10, there are the method of deriving the ranges on the basis of the transmission power control data set which the transmission power control data processing unit 211 sets to the target transmission power output level by means of the transmission power control data processing unit 211, and the parameters of the power supply voltage, the temperature, the frequency, the number of multiplexed channels, and the like at that point of time, and the method of defining the normal operation range and the failure operation range uniquely correspondingly to the target transmission power output level in advance at the stage of designing or developing to write the data within the defined ranges into the detected signal data table memory 214 or a dedicated table memory.

In case of the former method, the transmission power control processing unit 216 receives the transmission power control data set and the information of the parameters such as the power supply voltage and the temperature from the transmission power control data processing unit 211, and receives the information of the frequency and the number of multiplexed channels from the communication control unit 4. Then, by referring to these parameters, the transmission power control processing unit 216 sets the values Emax and Emin. As the method for the transmission power control processing unit 216 to obtain the data of the parameters such as the power supply voltage and the temperature, a method of obtaining the data directly from the A/D converters 113 and 115 may be used in place of the method of obtaining the data through the transmission power control data processing unit 211.

Next, the transmission power control processing unit 216 reads the detected signal data corresponding to the values Emax and Emin from the detected signal data table memory 214 to obtain the upper limit value Dmax and the lower limit value Dmin of the normal operation range.

Moreover, in case of the latter method, the transmission power control processing unit 216 receives the transmission power control data set from the transmission power control data processing unit 211, and reads the data of the normal operation range of the detected signal data corresponding to the received data set from the detected signal data table memory 214 or a dedicated memory to obtain the upper limit value Dmax and the lower limit value Dmin of the normal operation range.

Then, the transmission power control processing unit 216 detects failures on the basis of whether the detected signal data being the output of the A/D converter 123 exists within the obtained normal operation range or not.

Next, the failure detection method in the case where the mobile communication terminal is operating in the closed loop transmission power control will be described. The method is for detecting the failures on the basis of whether the expected value of the set of the IF AGC transmission power control data and the RF AGC transmission power control data corresponding to the detected signal data at that time exists within the forcast normal operation range or not.

That is, in contrast with the above-mentioned case of the open loop transmission power control mode, the case where the detected signal data is within the range of from Dmin to Dmax in FIG. 10 will be considered. In this case, as described above, because the logarithmic detection circuit 122 can compensate the frequency, the power supply voltage and the temperature, it is expected that the total transmission power output level of the mobile communication terminal is almost within the range of from Emin to Emax in case of operating normally.

Then, from FIG. 9, in case of operating normally, if the total transmission power output level of the mobile communication terminal is within the range of from Emin to Emax, it is expected that the transmission power control data set is set within the range of from Amin to Amax.

Consequently, if the transmission power control data set set in FIG. 9 is A2 in the case where the detected signal data exists in the range of from Dmin to Dmax, then the transmission power control data apparently shows an abnormal value to the detected standard output value. That is, in this case also, it can be judged that some failure occurs in the parts of the transmission signal processing system 120.

Now, similarly to the above-mentioned open loop transmission power control mode, as to the normal operation range and the failure operation range in FIG. 9, there are the method of deriving the ranges in the transmission power control data processing unit 211 and the method of writing the data ranges defined uniquely in advance at the stage of designing or developing into the detected signal data table memory 214 or a dedicated memory.

In the case where a failure is detected, the mobile communication terminal performs the processing dealing with the failure. At the time of the failure dealing processing, the following are considerable.

Generally, in the case where a mobile communication terminal transmits an up link signal to a base station, there are the case where the communication is performed by the slotted ALOHA system in which control information for registering a position or the like is transmitted, and the case where the communication is performed between the base station and a user after the establishment of a data link. Hereupon, in the latter case, when transmission operation is paused without performing normal cut off processing to the base station, bad influences are exerted on the side of the network of the base station.

In view of the above-mentioned problem, in the case where, for example, location registration is performed when trouble is detected during the transmission of the mobile communication terminal, the transmission operation is immediately stopped, and trouble report to the user is performed. Moreover, in the case where the mobile communication terminal is already communicating with the base station when trouble is detected during the transmission of the mobile communication terminal, the communication control unit 4 performs the normal call cut off processing before the "trouble" report to the user is performed.

Moreover, continuous using of the mobile communication terminal the trouble of which has been detected exerts bad influences in mobile communication services to both the sides of the base station and the user. Accordingly, in the case where the mobile communication terminal detects trouble during transmission and trouble report is performed to a user, means for the information by means of an animation on the screen of the display unit 10, for the information by means of singing by the speaker unit 8, for the information by means of vibrations by the vibrator unit 11, and for the information by means of light by the incoming LED unit 9 in FIG. 3 are provided, and these pieces of trouble report are performed simultaneously. Thereby, the abnormality is promptly informed to the user. Of course, not all of the above-mentioned information methods are adopted, but only one information method among them may be used, or some of them may be used in combination.

Figure 11:
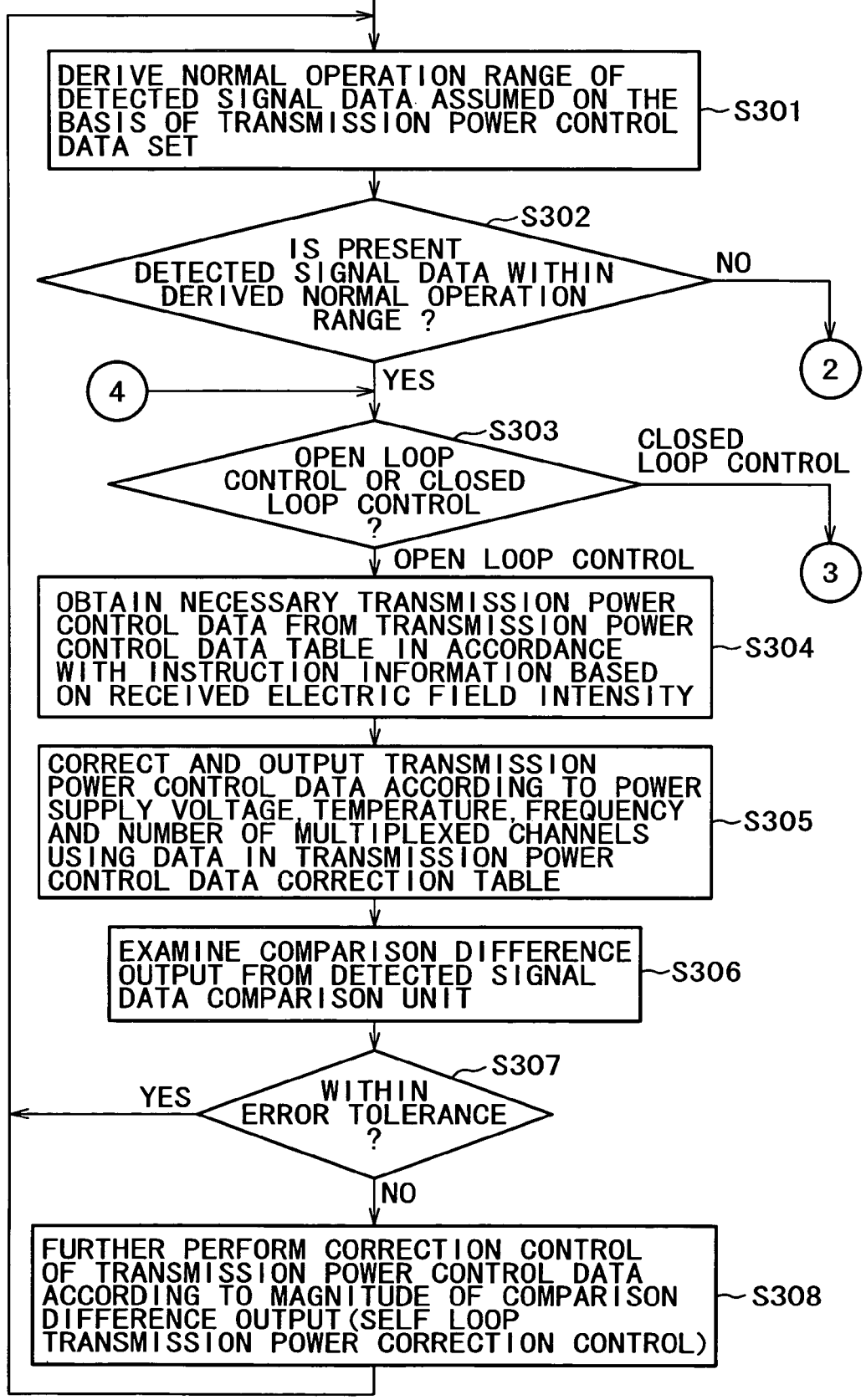
FIG. 11 is a part of a flowchart for explaining the failure detection operation in the mobile communication terminal of the embodiment.
Figure 12:
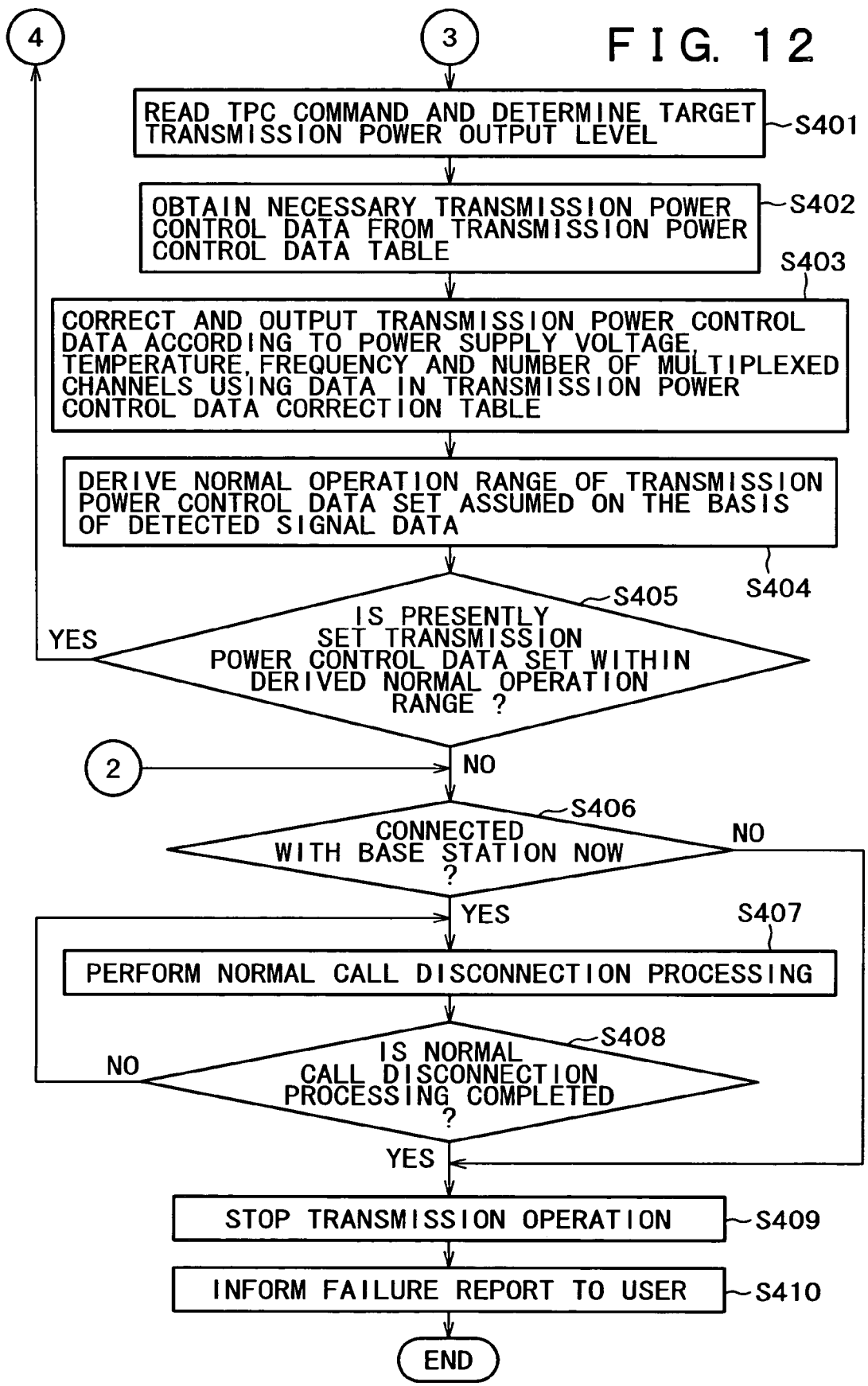
FIG. 12 is a part of the flowchart for explaining the failure detection operation in the mobile communication terminal of the embodiment.

The flowcharts of FIG. 11 and FIG. 12, the continuation of FIG. 11, are referred to while the above-mentioned trouble detection processing is further described. The example is the case where the normal operation range of the detected signal data is derived by the transmission power control processing unit 216.

First, as shown in FIG. 11, the transmission power control processing unit 216 receives the transmission power control data set and the information of the power supply voltage and the temperature from the transmission power control data processing unit 211 as described above. Then, the transmission power control processing unit 216 derives the normal operation range of the detected signal data assumed on the basis of the transmission power control data set in consideration of the information of the transmission frequency and the number of multiplexed channels from the communication control unit 4, also. That is, the values of the Dmax and the Dmin are obtained (Step S301).

Next, the transmission power control processing unit 216 takes in the present detected signal data from the A/D converter 123, and judges whether the detected signal data is within the normal operation range derived at Step S301 or not (Step S302).

When the transmission power control processing unit 216 judges at Step S302 that the detected signal data is not within the normal operation range, the transmission power control processing unit 216 informs the communication control unit 4 of the fact. The communication control unit 4 which received the information judges whether the mobile communication terminal is connected with a base station now or not (Step S406 in FIG. 12). When the communication control unit 4 judges that the mobile communication terminal is not connected to any base station, the communication control unit 4 controls the mobile communication terminal to stop the transmission operation (Step S409), and informs the application control unit 6 of the occurrence of trouble. The application control unit 6 which received the information of the occurrence of the trouble informs the user of the trouble by means of any one of, a combination of some of, or all of the speaker unit 8, the incoming LED unit 9, the display unit 10 and the vibrator unit 11, as described above (Step S410).

When the communication control unit 4 judges at Step S302 that the detected signal data is within the normal operation range, the transmission power control processing unit 216 judges whether the instruction from the communication control unit 4 instructs the open loop transmission power control mode or the closed loop transmission power control mode (Step S303).

Figure 5:
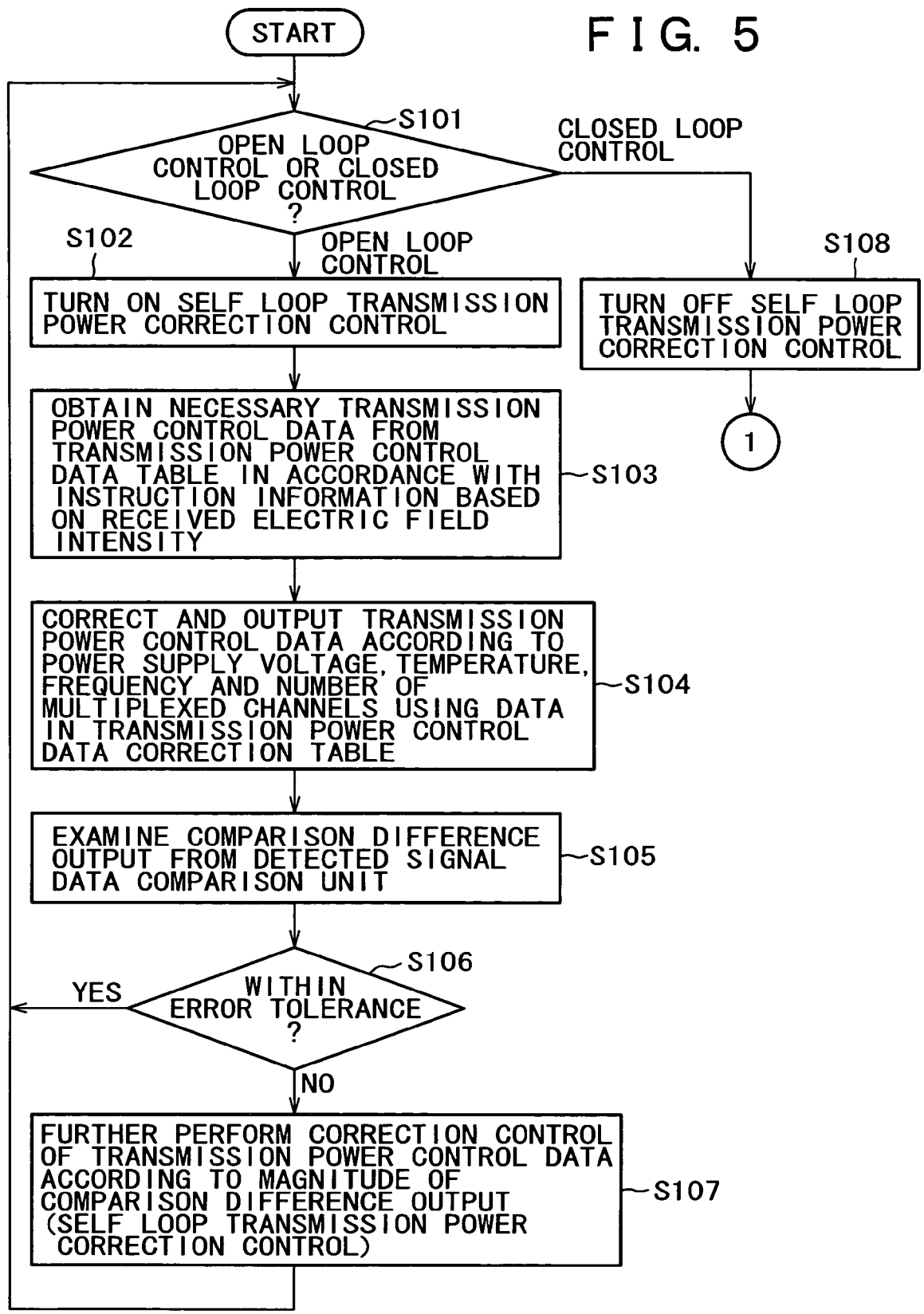
FIG. 5 is a diagram showing a part of a flowchart for explaining the control processing operation of a transmission power output level in the mobile communication terminal of the embodiment.

Then, when the transmission power control processing unit 216 judges at Step S303 that the open loop transmission power control mode is instructed, the transmission power control processing unit 216 makes the mobile communication terminal execute the processing of Steps S304–S308 quite similarly to the above-mentioned processing of Steps S102–S106 in FIG. 5, and controls the mobile communication terminal to perform the feed forward control based on the reception electric field intensity accompanied by the self loop transmission power correction control using the detected signal data. Then, the control processing returns to Step S301, and repeats the operation described above.

Moreover, when the transmission power control processing unit 216 judges at Step S303 that the closed loop transmission power control mode is instructed, the transmission power control processing unit 216 makes the mobile communication terminal execute the processing of Steps S401–S403 in FIG. 12 quite similarly to the above-mentioned processing of Steps S201–S203 in FIG. 6, and executes the closed loop transmission power control using TPC commands which the mobile communication terminal receives from the base station by a down link. As described above, in the closed loop transmission power control mode, the self loop transmission power correction control using the detected signal data is not performed.

Then, the transmission power control processing unit 216 takes in the present detected signal data from the A/D converter 123, and receives the information of the power supply voltage and the temperature from the transmission power control data processing unit 211. Moreover, also in consideration of the information of the transmission frequency and the number of multiplexed channels from the communication control unit 4, the transmission power control processing unit 216 derives the normal operation range of the transmission power control data set assumed on the basis of the detected signal data. That is, the transmission power control processing unit 216 obtains the values of the Amax and the Amin (Step S404).

Next, the transmission power control processing unit 216 takes in the present transmission power control data set from the transmission power control data processing unit 211, and judges whether the data set is within the normal operation range derived at Step S404 or not (Step S405). When the transmission power control processing unit 216 judges that the data set is within the normal operation range, the control processing returns to Step S303 in FIG. 11. Then, the transmission power control processing unit 216 judges whether the open loop transmission power control mode is instructed or the closed loop transmission power control mode is instructed, and repeats the operation described above after that.

When the transmission power control processing unit 216 judges at Step S405 that the transmission power control data set is not within the normal operation range, the transmission power control processing unit 216 informs the communication control unit 4 of the fact. The communication control unit 4 which received the information judges whether the mobile communication terminal is connected to a base station now or not (Step S406 in FIG. 12). When the communication control unit 4 judges that the mobile communication terminal is not connected to any base station, the communication control unit 4 controls the mobile communication terminal to stop the transmission operation (Step S409), and informs the application control unit 6 of the occurrence of trouble. The application control unit 6 which received the information of the occurrence of the trouble informs the user of the trouble by means of any of, a combination of some of, or all of the speaker unit 8, the incoming LED unit 9, the display unit 10 and the vibrator unit 11 (Step S410).

In the way described above, according to this embodiment, by using the detected signal data, the trouble detection of a part of the transmission signal processing system, which was difficult by the prior art, can be performed.

Incidentally, in the example of FIG. 11 and FIG. 12, the processing at the time of the closed loop transmission power control mode in the vicinity of the maximum value of the standard range of the transmission power output level and in the vicinity of the minimum value thereof, which was described in connection with FIG. 5 and FIG. 6, was not performed. However, also in the example of FIG. 11 and FIG. 12, it is needless to say that the processing in the vicinity of the maximum value of the standard values of the transmission power output level and in the vicinity of the minimum value thereof is also performed at the time of the closed loop transmission power control mode.

Moreover, the embodiment described above pertains to the case where the present invention is applied to the transmission output circuit of the mobile communication terminal of the DS-CDMA system, it is needless to say that the transmission output circuit of this invention is not limited to the embodiment.

INDUSTRIAL APPLICABILITY

As described above, according to this invention, it is possible to perform the trouble detection of a transmission output circuit, which was difficult by the prior art. Moreover, by detecting the output of a power amplifier to monitor the output, the transmission power output level can be suppressed within the range of standard values. Consequently, the present invention can previously prevent the defects such as the interference with the mobile communication terminals of other users, the nonarrival of an up link signal to a base station in a fringe area, and the like.

As the result, according to this invention, in a mobile communication service, the deterioration of cell capacity can be prevented on the side of a telecommunications carrier, and the causes of difficulty in connection and the like can be informed ahead of time by trouble display on the side of a terminal user. Consequently, the present invention can achieve the improvement of the quality of services.

Moreover, according to the transmission output circuit of this invention, even if changes of a temperature, a power supply voltage, or changes of a frequency, the number of multiplexed channels have occurred, accurate transmission power control can be always performed, and thereby the problem of nonsatisfaction of transmission characteristic standards based on part dispersion or the like at the time of mass production can be overcome.

The invention claimed is:

1. A transmission output circuit comprising:
  gain control amplification means for varying gain of an input signal in accordance with a gain control signal;
  power amplification means for amplifying power of an output signal from said gain control amplification means;
  transmission power output level instruction means for specifying a target transmission power output level;
  transmission power control data generation means for generating the gain control signal for performing a feed forward control of said gain control amplification means in order that an output signal level of said power amplification means becomes said target transmission power output level;
  detection means for obtaining detected signal data by detecting the output signal of said power amplification means; and
  judgment means for judging existence of occurrence of trouble in a transmission output system by determining whether said detected signal data from said detection means or said gain control signal are within a determined range,
  wherein said feed forward control is a closed loop control based on a transmission power control data form a transmission side; and
  wherein said judgment means judges the existence of occurrence of trouble by determining whether present gain control signal is within a data range assumed relative to said present detecting signal data obtained from said detection means.

2. The transmission output circuit as cited in claim 1, further comprising:
    means for deriving said data range.
3. The transmission output circuit as cited in claim 1, further comprising:
    memory means for storing data of said data range.
4. A transmission output circuit comprising:
    gain control amplification means for varying gain of an input signal in accordance with a gain control signal;
    power amplification means for amplifying power of an output signal from said gain control amplification means;
    transmission power output level instruction means for specifying a target transmission power output level;
    transmission power control data generation means for generating the gain control signal for performing a feed forward control of said gain control amplification means in order that an output signal level of said power amplification means becomes said target transmission power output level;
    detection means for obtaining detected signal data by detecting the output signal of said power amplification means;
    judgment means for judging existence of occurrence of trouble in a transmission output system by determining whether said detected signal data from said detection means or said gain control signal are within a determined range;
    a transmission power control data table in which a transmission power control data for generating control voltage to be supplied to said gain control amplification means and corresponding to various values of said transmission power output level is written;
    power source voltage detection means for detecting the power source voltage and for supplying data of the detected power source voltage to said transmission power control data processing means;
    temperature detection means for detecting temperature and for supplying data of the detected temperature to said transmission power control data processing means;
    a transmission power control data correction table in which correction data for said transmission power control data is written while said power source voltage and said temperature being as parameters; and
    transmission power control data processing means for processing transmission power control data relative to said target transmission power output level while obtaining said correction data of said transmission power control data corresponding to said data for the said power source voltage and data for said temperature from said transmission power control data correction table.
5. The transmission output circuit as cited in claim 4, further comprising:
    a detection signal data table to which detection signal data corresponding to various values of said transmission power output level is written; and
    detection signal data comparison means for comparing detection signal data obtained from said detection circuit with the detection signal data corresponding to said target transmission power output level from said detection signal data table,
    wherein said transmission power control data processing means outputs transmission power control data relative to said target transmission power output level after applying correction processing so that comparison output data of said detection signal data comparison means becomes equal or less than a predetermined level.
6. A transmission output circuit comprising:
    gain control amplification means for varying gain of an input signal in accordance with a gain control signal;
    power amplification means for performing power amplification of an output signal of said gain control amplification means;
    detection means for detecting an output signal of said power amplification means to obtain detected signal data;
    a detected signal data table in which the detected signal data corresponding to various values of said transmission power output level is written;
    a transmission power control data table in which transmission power control data for generating control voltages to be supplied to said gain control amplification means, the control voltages corresponding to various values of said transmission power output level, is written;
    detected signal data comparison means for comparing said detected signal data obtained by said detection means with said detected signal data corresponding to said target transmission power output level from said detected signal data table; and
    transmission power control data processing means for operating transmission power control data to said target transmission power output level on a basis of present transmission power control data from said transmission power control data table and comparison output data from said detection signal comparison means,
    wherein said transmission power control data processing means outputs transmission power control data relative to said target transmission power output level after applying correction processing so that the comparison output data of said detection signal data comparison means becomes equal or less than a predetermined level.
7. The transmission output circuit as cited in claim 6, further comprising:
    power source voltage detection means for detecting the power source voltage and for supplying data of thus detected power source voltage to said transmission power control data generation means;
    temperature detection means for detecting temperature and for supplying data of thus detected temperature to said transmission power control data generation means; and
    a transmission power control data correction table in which correction data for said transmission power control data where said power source voltage and said temperature are written as parameters;
    wherein said transmission power control data generation means for processing transmission power control data relative to said target transmission power output level while obtaining said correction data of said transmission power control data corresponding to said data for the said power source voltage and data for said temperature from said transmission power control data correction table.
8. The transmission output circuit as cited in claim 7,
    wherein when value of said comparison output data from said detection signal data comparison means is within a predetermined range, said transmission power control data generation means processes transmission power control data relative to said target transmission power output level based on the data corrected by using said correction data from said transmission power control data correction data table independent of the value of said comparison output data from said detection signal data comparison means.

9. The transmission output circuit as cited in claim 6, further comprising:
 a transmission power control data correction table in which correction data for said transmission power control data wherein transmission frequency and or the number of transmission multiplexed channels are parameters;
 wherein said transmission power control data generation means processes said transmission power control data relative to said target transmission power control level by obtaining said correction data for the transmission power control data corresponding to said present transmission frequency and or the present number of transmission multiplexed channels from said transmission power control data correction table.

10. The transmission output circuit as cited in claim 9, wherein said number of transmission multiplexed channels corresponds to the number of spread code for spectrum-spreading the transmission signal and is for a mobile communication of a DS-CDMA system.

11. The transmission output circuit as cited in claim 9, further comprising:
 a detection signal data correction table in which correction data for said detection signal control data is written while transmission frequency and or the number of transmission multiplexed channels being as parameters,
 wherein said detection signal data corresponding to said target transmission power output level which is compared with said detection signal data obtained from said detection means by said detection signal data comparison means and is obtained from said detection signal data correction table is corrected using values of said detection signal data correction table.

12. The transmission output circuit as cited in claim 11, wherein said number of transmission multiplexed channels corresponds to the number of spread code for spectrum-spreading the transmission signal and is for a mobile communication of a DS-CDMA system.

13. The transmission output circuit as cited in claim 6, wherein when value of said comparison output data from said detection signal data comparison means is within a predetermined range determined previously, said transmission power control data generation means processes transmission power control data relative to the target transmission power output level based on the transmission power control data from said transmission power control data table independent of the value of said comparison output data from said detection signal data comparison means.

14. The transmission output circuit as cited in claim 6, further comprising:
 a mode for carrying out a closed loop transmission power control by designating target transmission power control output level from said transmission power output level instruction means based on the transmission power control data transmitted from an opponent to transmit; and
 a mode for carrying out an open loop transmission power control by designating target transmission power output level from said transmission power output level instruction means based on the received intensity,
 wherein when operating said mode for carrying out said closed loop transmission power control, said transmission power control data generation means processes transmission power control data from said transmission power control data table to transmission power control data relative to target transmission power control output level based on data corrected using said correction data from said transmission power control data correction data independent of the value of said comparison output data from said detection signal data comparison means.

15. A transmission output circuit comprising:
 gain control amplification means for varying gain of an input signal in accordance with a gain control signal;
 power amplification means for performing power amplification of an output signal of said gain control amplification means;
 transmission power output level instruction means for designating target transmission power output level based on transmission power control data transmitted from an opponent to transmit;
 transmission power control data generation means for generating said gain control signal for carrying out a feed forward control of said gain control amplification means so that output signal level of said power amplification means becomes said target transmission power output level;
 detection means for obtaining detected signal data by detecting output signal from said power amplification means;
 first judgement means for judging whether said detected signal data from said detection means is within a range which becomes maximum transmission power specified value;
 second judgement means for judging whether said detected signal data from said detection means is within a range which becomes minimum transmission power specified value; and
 control means for ignoring transmission power control data when it is judged by said first judgement means that said detection signal data is within the range of said maximum transmission power specified value and when said transmission power control data from said transmission side is for further increasing said transmission power output level, and for ignoring transmission power control data when it is judged by said second judgement means that said detection signal data is within the range of said minimum transmission power specified value and when said transmission power control data from said transmission side is for further decreasing said transmission power output level.

16. The transmission output circuit as cited in claim 15, wherein a range which becomes said maximum transmission power specified value and/or a range which becomes said minimum transmission power specified value is/are able to be freely set.

17. A mobile communication terminal comprising:
 gain control amplification means for varying gain of an input signal in accordance with a gain control signal;
 power amplification means for amplifying power of an output signal from said gain control amplification means;
 transmission power output level instruction means for specifying a target transmission power output level;
 transmission power control data generation means for generating the gain control signal for performing a feed forward control of said gain control amplification means in order that an output signal level of said power amplification means becomes said target transmission power output level;

detection means for obtaining detected signal data by detecting the output signal of said power amplification means;

judgment means for judging existence of occurrence of trouble in a transmission output system by determining whether said detected signal data from said detection means or said gain control signal are within a determined range; and means for carrying out trouble report to a user when said judgment means judges that said detection signal data from said detection means is not a value for normal operation.

18. The mobile communication terminal as cited in claim 17, further comprising:

means for judging whether the mobile communication terminal is in communication with a base station when said judgement means judges that the said detection signal data from said detection means is not within the value for normal operation range; and means for stopping the transmission operation after carrying out call disconnection processing when said judging means judges that the mobile communication terminal is in communication with the base station.

19. The mobile communication terminal as cited in claim 17, wherein said means for carrying out the trouble report carries out said trouble report by either a report displayed on a display screen, a report by audio from a speaker, a report by vibrator, of a vibrator or a report by a light emitting diode.

* * * * *